(12) United States Patent
Gillen

(10) Patent No.: US 6,345,507 B1
(45) Date of Patent: Feb. 12, 2002

(54) COMPACT THERMOELECTRIC COOLING SYSTEM

(75) Inventor: Adelbert M. Gillen, New Hope, PA (US)

(73) Assignee: Electrografics International Corporation, Warminster, PA (US)

(*) Notice: Subject to any disclaimer, the term of this patent is extended or adjusted under 35 U.S.C. 154(b) by 0 days.

(21) Appl. No.: 09/677,011

(22) Filed: Sep. 29, 2000

(51) Int. Cl.[7] ............................................. F25B 21/02

(52) U.S. Cl. ............................ 62/3.7; 62/3.3; 136/203

(58) Field of Search ............................ 62/3.7, 3.2, 3.3, 62/259.2, 159, 126; 165/253; 136/203

(56) References Cited

U.S. PATENT DOCUMENTS

| | | | |
|---|---|---|---|
| 3,121,998 A | 2/1964 | Nagata | 62/3 |
| 4,245,479 A | 1/1981 | Richter, Jr. et al. | 62/119 |
| 4,253,515 A | 3/1981 | Swintosz | 165/61 |
| 4,259,843 A | 4/1981 | Kausch | 62/3 |
| 4,301,658 A | 11/1981 | Reed | 63/3 |
| 4,375,157 A | 3/1983 | Boesen | 62/514 R |
| 4,467,611 A | 8/1984 | Nelson et al. | 62/3 |
| 4,554,793 A | 11/1985 | Harding, Jr. | 62/126 |
| 4,601,587 A | 7/1986 | Mathiprakasam | 374/25 |
| 4,935,864 A | 6/1990 | Schmidt et al. | 363/141 |
| 5,032,897 A | 7/1991 | Mansuria et al. | 357/81 |
| 5,371,665 A | 12/1994 | Quisenberry et al. | 363/89 |
| 5,398,510 A * | 3/1995 | Gilley et al. | 62/3.6 |
| 5,566,062 A | 10/1996 | Quisenberry et al. | 363/89 |
| 5,682,748 A | 11/1997 | DeVilbiss et al. | 62/3.7 |
| 5,689,957 A | 11/1997 | DeVilbiss et al. | 62/3.7 |
| 5,890,371 A | 4/1999 | Rajasubramanian et al. | 62/259.2 |
| 6,058,712 A | 5/2000 | Rajasubramanian et al. | 62/3.6 |

* cited by examiner

Primary Examiner—Henry Bennett
Assistant Examiner—Chen-Wen Jiang
(74) Attorney, Agent, or Firm—Woodcock Washburn LLP

(57) ABSTRACT

A compact self-contained thermoelectric cooler (TEC) is provided by utilizing a DC to DC active power supply to provide compact size. The compactness and flatness of the DC to DC active power supply allows the unit to be completely self-contained. The compactness and flatness of the DC to DC active power supply allow the power supply assembly to be located on the hot side of the TEC. A non-planar barrier between the hot side and cold side of the TEC also provides compactness and allows the TEC to be completely self-contained. A mounting frame is disposed between the hot and cold side. The mounting frame includes a power pack cutout allowing a non-planar barrier between the hot and cold side. Electrical components of the power supply are mounted to a power pack heat sink. The power pack heat sink is attached to the mounting frame with electrical components protruding through the power pack cutout. Power pack cover is attached to the cold side of the mounting frame, encapsulating the electrical components and creating a non-planar barrier between the hot side and the cold side of the TEC. The TEC includes several moisture resistant barriers and thermally isolating barriers to improve performance and longevity. A moisture resistant barrier is provided around at least one thermoelectric module and around a power supply assembly. A non-planar thermally isolating barrier is provided between the hot side and cold side of the TEC. A power control system is provided to deliver maximum cooling power for a given design and a give set of operating conditions. Finally, a dual power supply may be provided to increase reliability.

39 Claims, 13 Drawing Sheets

COMPACT THERMOELECTRIC COOLING SYSTEM

FIELD OF THE INVENTION

The present invention generally relates to the field of thermoelectric heat exchangers, which may function either as a heater or a cooler. More particularly, the present invention relates to an improved design of a thermoelectric cooler (TEC), including power system design and packaging design, which result in compactness, increased efficiency, and increased reliability.

BACKGROUND OF THE INVENTION

TEC's perform the same cooling function as freon-based vapor compression or absorption refrigerators and air conditioners. In all such units, thermal energy is extracted from a region, thereby reducing its temperature, then rejected to a "heat sink" region of higher temperature. While freon based systems utilize the gas vaporization and compression cycle to perform cooling, thermoelectric coolers utilize the temperature difference that is created across a semiconductor thermocouple when voltage is applied.

A conventional cooling system contains three fundamental parts—the evaporator, compressor and condenser. The evaporator or cold section is the part where the pressurized refrigerant is allowed to expand, boil and evaporate. During this change of state from liquid to gas, energy (heat) is absorbed. The compressor acts as the refrigerant pump and recompresses the gas to a liquid. The condenser expels the heat absorbed at the evaporator plus the heat produced during compression, into the environment or ambient. Vapor-cycle devices have moving mechanical parts and require a working fluid, while thermoelectric elements are totally solid state.

Solid state heat pumps have been known since the discovery of the Peltier effect in 1834. In the Peltier effect, a voltage applied to the junction between two dissimilar metals creates a temperature difference between the two metals. This temperature differential can be used for cooling or for heating.

The devices became practical only recently, however, with the development of semiconductor thermocouple materials. TEC thermocouples are made from two elements of semiconductor, primarily Bismuth Telluride. The semiconductor is heavily doped to create an excess (n-type) and a deficiency (p-type) of electrons. The junction between the n-type and the p-type is a semiconductor thermocouple. At the cold side, energy (heat) is absorbed by electrons as they pass from a low energy level in the p-type semiconductor element, to a higher energy level in the n-type semiconductor element. The power supply provides the energy to move the electrons through the system. At the hot side, energy is expelled to a heat sink as electrons move from a high energy level element (n-type) to a lower energy level element (p-type). Heat absorbed at the cold side is pumped to the hot side at a rate proportional to current passing through the circuit and the number of couples.

These thermocouples, connected in series electrically and in parallel thermally, are integrated into thermoelectric modules. The thermoelectric modules are packaged between metallized ceramic plates to afford optimum electrical insulation and thermal conduction with high mechanical strength in compression. Thermoelectric modules can be mounted in parallel to increase the heat transfer effect or can be stacked in multistage cascades to achieve high differential temperatures. Solid state cooling is relatively simple compared to some of the classical technique using a compressor because there are no moving parts. These devices have the capability to be either heating systems or cooling systems depending on the direction of the current. Thermoelectric modules are divided into a hot side and a cold side, and are typically attached to heat sinks, creating a heat exchanger for use in a TEC.

Development of TECs has enabled the production of commercial miniature solid state air conditioners for cooling enclosures for devices such as electronics lasers, computers, scientific and medical equipment, as well as other similar equipment. Conventional cooling systems for enclosures remove the heat from one place (usually termed a hot spot) and blow the heat somewhere else in the enclosure until it is eventually vented or otherwise conducted/radiated outside. A common technique for cooling is through the use of an exhaust fan that draws outside air (often through filters) through the enclosure. However, certain electronics applications are sealed in an enclosure from the outside environment. This typically dictates the use of a heat exchanger for cooling because a heat exchanger can control the internal temperature of the enclosure without exchanging air between the enclosure and the outside environment. A TEC works well in many of these cooling applications.

However, these TEC's have some disadvantages. Moisture reaching the thermoelectric modules or the electrical components can reduce reliability. The cooling surface of the TEC often condenses out moisture from the air. The presence of even small droplets of water can cause damage to the thermoelectric modules and this may reduce the operational life of the device and the efficiency of the system. Also, in commercial applications of TECs, the units may be exposed to dust, dirt and water (rain or deliberate wash-down water from cleaning purposes). This exposure to dust, dirt, and water may decrease the reliability and efficiency of the system. In some cases, the units are exposed to acid or chemical attack. Other units require protection from explosive chemicals. Therefore, a TEC, which seals (so as to be highly moisture resistant) the thermoelectric modules would be very desirable. Additionally, a TEC which seals electrical components would be very desirable.

Also, moisture travelling between the hot side and cold side of the TEC may reduce system efficiency by allowing heat to transfer between the hot side and the cold side of the TEC. Also, any moisture placed on the hot side of the TEC (for example by washdowns, etc.) may penetrate into the cold side of the TEC. This may lead to damage of the devices contained in the enclosure or potentially damage the TEC itself. Therefore, a TEC, which seals (so as to be highly moisture resistant) between the hot side and cold side of the TEC would be very desirable.

Another disadvantage of conventional TEC's is that they are typically designed with a relatively small cooling capacity. Because of this relatively small cooling capacity, it is important to maximize the thermal isolation between the hot side and cold side of the TEC.

Any transfer of heat from the hot side to the cold side will reduce system performance and efficiency. Any thermal load on the TEC may affect its efficiency. There are generally two, but not limited to two, broad classifications of heat that must be removed from the enclosure. The first is the real, sensible, or active heat load. This is the load that is intended to be cooled. This load could be the $I^2R$ load of an electrical component, the load of dehumidifying air, or the load of cooling objects.

The other kind of load is often referred to as the parasitic load. This is the load due to the fact that the object is cooler than the surrounding environment. This load can be comprised of conduction and convection of the surrounding gas, thermal leak through insulation, conduction through wires, waste heat generated from the TEC's own internal electrical components, condensation of water, and in some cases formation of ice. Regardless of the source of these parasitic loads, they all have potential to affect TEC efficiency.

Thermal loads from the energy dissipation of the TEC's electrical components may become important and effect operational efficiency if not properly designed. Any airflow or moisture flow between the hot side and the cold side of the cooling system may also reduce overall performance. Therefore, a TEC with improved thermal isolation, improved sealing between the hot and cold side, and/or improved design regarding parasitic loads would be desirable.

Another disadvantage of conventional TEC's is the size. TEC's may utilize numerous thermoelectric modules and consume relatively high power, which in certain applications may exceed 800 watts. Most potential industrial/commercial users want standard 120VAC/230VAC power operable equipment. However, thermoelectric modules typically require low voltage, high current DC power. This requires a converter to change 120VAC or 230VAC to low voltage DC. Power conversion using a transformer, diode bridge and smoothing capacitor is a possible choice. However, these conventional devices are large, heavy and not portable in power levels of 300–1000 watts. Use of a transformer/bridge-capacitor power converter adds too much weight and bulk to be commercially acceptable for a compact unit. Standard switching supplies provide better power-to-weight ratios, but they present packaging and sealing problems. Switching supplies offer reduced size and bulk, but are not offered in packages suitable for integration into an air conditioner package. The power supply should also give a DC power with minimal AC ripple. Any AC component on the DC may be detrimental. Additionally, the power system should be lightweight, small, with a flat format and still deliver 600 or more watts. Therefore, a thermoelectric power supply with low AC ripple, low weight, compact in size, and with a flat format would be desirable.

Some conventional TEC's have a remotely mounted power supply, with the associated electrical components located outside of the housing of the TEC. However, the disadvantage with these TEC's is that require separate mounting of the power supply and the user must electrically connect the remotely mounted power supply to the TEC. Therefore, a self-contained TEC would be desirable. Self-contained means that the power supply is mounted within the housing of the TEC.

Another disadvantage of conventional TEC's is that they may operate inefficiently with conventional control systems. Because the performance of a thermoelectric module varies with temperature, conventional control systems may cause the TEC to operate at an inefficient level. In order to maintain a high level of performance efficiency and to avoid the cost of a larger power supply, it is valuable to adjust the power supply using a power control circuit to maximize the cooling that the TEC supplies for a given design and a given set of operating conditions. It is also important to limit the power to the safe operational limit of the thermoelectric module.

It is well known that thermoelectric modules characteristically have an impedance that varies with both the temperature of the hot side of the thermoelectric module and with the temperature difference between the hot side and the cold side of the thermoelectric module. Conventional control systems for TEC's vary greatly but can be generally considered in two groups: Open Loop and Closed Loop, or manual and automatic respectively. Regardless of the method of control, the easiest device parameter to detect and measure is temperature. Therefore, the cold side (or hot side in heating mode) is usually used as a basis of control. The controlled temperature is compared to some reference temperature, typically the ambient or opposite face of the TEC. In the Open Loop method, an operator adjusts the power supply to reduce the error to zero. The Closed Loop method accomplishes this task electronically. However, because both of these methods typically output a constant voltage, thermoelectric module may operate at an inefficient voltage level. Therefore, it is desirable for a compact thermoelectric cooler to control the output power level for the maximum level of cooling.

Another disadvantage with TEC's is reliability. TEC's are sometimes used in harsh environments which may decrease their reliability. Because there is only one power supply, if the one power supply fails, the entire TEC fails. This may cause overheating in the enclosure, potentially damaging equipment. Therefore, it is desirable to design a more fault tolerant TEC.

SUMMARY OF THE PRESENT INVENTION

The present invention is directed to a TEC with moisture resistant barriers around the thermoelectric modules, around the electrical components of the power system, and between the hot side and the cold side of the TEC. This is provided by completely sealing the electrical components and the thermoelectric modules. The seals are achieved with at least one of a sealant, a gasket, and blind fastener holes. To seal the thermoelectric modules, a sealing frame is also used.

Additionally, the present invention is directed to providing a sealing system that inhibits the penetration of moisture between the hot and cold sides of the TEC. This moisture resistance is provided by completely sealing the hot side of the heat exchanger from the cold side.

The present invention is also directed to providing a TEC with increased thermal isolation between the hot side and cold side of the TEC. Increased thermal isolation is provided by completely sealing the hot side of the heat exchanger from the cold side. The sealing design also minimizes any airflow between the hot and cold side of the cooling system, increasing thermal isolation and efficiency. Thermal isolation is also provided by including insulation between the hot side and cold side of the TEC and sufficient spacing between the hot side heat sinks and the cold side heat sinks. It is additionally provided by the design of the power system and packaging techniques in order to minimize the thermal losses and heat contribution from the electrical components. This is provided by designing the system to draw the heat from the heat generating components to the hot side of the TEC, rather than the cold side.

In addition, the present invention is directed to a compact design. A compact design is provided by the use of a DC to DC active power supply and packaging techniques. A DC to DC active power supply avoids the need for a large, heat producing transformer. A DC to DC active power supply therefore, reduces the size of a TEC, and also increases the efficiency. The use of a DC to DC active power supply with a flat format allows packaging techniques that exhaust the heat generated from electrical components to the hot side of the TEC, minimizing the amount of parasitic load. The use of a flat DC to DC active power supply also minimizes the amount of space required to for the electrical components.

The present invention is also directed to maximize the cooling for a given TEC design. The design of a power control circuit provides for maximum cooling of the TEC. This is accomplished by a control circuit that varies the power input to the thermoelectric modules based on the temperature of the hot side of the thermoelectric module and the hot side of the TEC (ambient temperature).

The present invention is also directed to providing increased TEC reliability by supplying two or more DC to DC active power supplies. Each DC to DC active power supply is connected to one or more thermoelectric modules. In this method, even if one DC to DC active power supply fails, several of the thermoelectric modules will still receive power and continue to operate.

The present invention is directed to a compact, self-contained thermoelectric cooler including, a housing having a hot side and a cold side, at least one thermoelectric module disposed between the hot side and the cold side, and a power supply assembly within the housing. The power supply assembly includes a DC to DC active power supply. A mounting frame is disposed between the hot side and the cold side. The mounting frame may also have a mounting flange formed over the outer periphery of at least two sides of a planar body of the mounting frame, and that extend outside of the housing.

The present invention is directed to a compact, self-contained thermoelectric cooler further including a power pack cutout in the mounting frame. A power pack heat sink having a base portion and a plurality of fins, is mounted on the hot side of the mounting frame with the base portion proximate to the power pack cutout. A gasket is attached to the cold side of the mounting frame proximate to the power pack cutout. A power pack cover comprising a base, having four sides extending from a peripheral edge of the base to an outer edge, the base and the four sides defining a cavity, is secured to the gasket, with the outer edge contacting the gasket. The mounting frame, the gasket, and the power pack cover form a barrier between the hot side and the cold side. A plurality of electrical components mounted on the base portion of the power pack heat sink and extending through the power pack cutout are located on the hot side of the barrier. A cover seal may be disposed over the outer edge of the power pack cover.

The present invention is directed to a compact, self-contained thermoelectric cooler further includes a hot side cover attached to the hot side of the mounting frame. The hot side fan has at least one fan opening in the hot side cover. The at least one hot side fan is mounted to the hot side cover, proximate to the fan opening. The compact, self-contained thermoelectric cooler also includes a cold side cover attached to the cold side of the mounting frame. The cold side cover has at least one fan opening in the cold side cover. The at least one cold side fan is mounted to the cold side cover, proximate to the fan opening.

The present invention is directed to a compact, self-contained moisture resistant thermally isolated thermoelectric cooler including at least one moisture resistant barrier, around either the at least one thermoelectric module or around the plurality of electrical components; and a thermal resistant barrier between the hot side and the cold side.

The moisture resistant barrier around the plurality of electrical components includes a sealant between the power pack heat sink and the mounting frame. A gasket is attached to the cold side of the mounting frame proximate to the power pack cutout. A power pack cover including a base having four sides extending from a peripheral edge of the base to an outer edge, is secured to the gasket. Preferably, a cover seal disposed over the outer edge of the power pack cover.

The moisture resistant barrier around the thermoelectric modules includes a sealant between the hot side heat sink and the mounting frame. A sealing frame having a bottom surface, an outer surface extending from a peripheral edge of the bottom surface, and a free edge formed at a distal end of the outer surface, and a sealing frame opening in the bottom surface, is mounted on the cold side of the mounting frame proximate to the heat sink cutout. A sealant is disposed between the sealing frame and the mounting frame. A sealant is disposed between the free edge of the sealing frame and the cold side heat sink.

The thermal barrier between the hot side and the cold side includes a sealant between the hot side heat sink and the mounting frame. A sealant is disposed between the power pack heat sink and the mounting frame. A gasket is attached to the cold side of the mounting frame proximate to the power pack cutout. A power pack cover including a base having four sides extending from a peripheral edge of the base to an outer edge, is secured to the gasket. Preferably, a cover seal is disposed over the outer edge of the power pack cover. A sealing frame having a bottom surface, an outer surface extending from a peripheral edge of the bottom surface, and a free edge formed at a distal end of the outer surface, and a sealing frame opening in the bottom surface, is mounted on the cold side of the mounting frame proximate to the heat sink cutout. A sealant is disposed between the sealing frame and the mounting frame; and a sealant between the free edge of the sealing frame and the cold side heat sink.

The power pack heat sink has a plurality of blind holes in the base portion of the power pack heat sink, corresponding to a plurality of through holes in the power pack cover. A plurality of fasteners is disposed through the plurality of holes in the power pack cover and secured in the plurality of blind holes in the base portion of the power pack heat sink.

The hot side heat sink has a plurality of blind holes in the base portion of the hot side heat sink, corresponding to a plurality of through holes in the cold side heat sink. A plurality of fasteners is disposed through the plurality of holes in the cold side heat sink and secured in the plurality of blind holes in the base portion of the hot side heat sink. The cold side heat sink may have thermally conductive spacer blocks integrally formed in the cold side heat sink.

The present invention is directed to a thermoelectric cooler including a programmable power control system. The programmable power control system includes a first thermal sensing element for sensing a first temperature on the hot side of the thermoelectric module system. A first input channel is electrically connected to the first thermal sensing element. A second thermal sensing element for sensing a second temperature is located on the hot side of the thermoelectric cooler system. A second input channel is electrically connected to the second thermal sensing element. A processing unit is electrically connected and adapted to read the first temperature from the first input channel and the second temperature from the second input channel. The processing unit calculates a temperature difference, reads from a lookup table to determine an optimum operating voltage based on the temperature difference, and outputs a signal to control power output based on the temperature difference.

The present invention is directed to a method for controlling power to a thermoelectric cooler including the steps of sensing a first temperature on a hot side of a thermoelectric module of the thermoelectric cooler, sensing a second temperature on a hot side of the thermoelectric cooler, inputting the first sensed temperature to a first input channel; inputting the second sensed temperature to a second input channel, reading the first input channel and the second input channel into a processing unit for determining the optimum power output determining a temperature difference between the first temperature and the second temperature, determining an optimum power output for the temperature difference; and outputting a power output control signal.

The present invention is directed to a first DC to DC active power supply in the housing, electrically connected to the least one first thermoelectric module and a second DC to DC active power supply in the housing, electrically connected to the least one second thermoelectric module. Preferably, the first DC to DC active power supply is also electrically connected to the at least on second thermoelectric module; and the second DC to DC active power supply is also electrically connected to the at least on first thermoelectric module.

BRIEF DESCRIPTION OF THE DRAWINGS

The present invention is further described in the detailed description that follows, by reference to the noted plurality of drawings by way of non-limiting examples of preferred embodiments of the present invention, in which like references numerals represent similar parts throughout the several views of the drawings, and wherein.

DETAILED DESCRIPTION OF THE PREFERRED EMBODIMENTS

Figure 1:
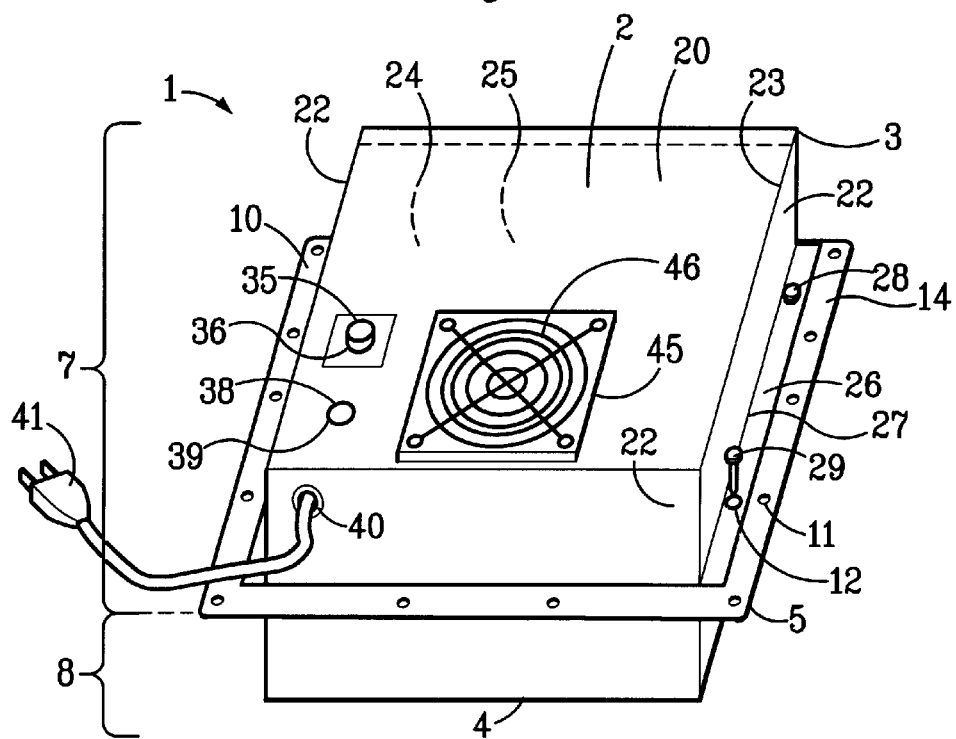
FIG. 1 is a perspective view of an exemplary TEC in accordance with the present invention.

The present invention is directed to an improved thermoelectric heat exchanger. TEC thermocouples are used in a thermoelectric heat exchanger. TEC thermocouples are made from two elements of semiconductor, primarily Bismuth Telluride. The semiconductor is heavily doped to create an excess (n-type) and a deficiency (p-type) of electrons. The junction between the n-type and the p-type is a semiconductor thermocouple. At the cold side, energy (heat) is absorbed by electrons as they pass from a low energy level in the p-type semiconductor element, to a higher energy level in the n-type semiconductor element. The power supply provides the energy to move the electrons through the system. At the hot side, energy is expelled to a heat sink as electrons move from a high energy level element (n-type) to a lower energy level element (p-type). Heat absorbed at the cold side is pumped to the hot side at a rate proportional to current passing through the circuit and the number of couples.

These thermocouples, connected in series electrically and in parallel thermally, are integrated into thermoelectric modules. The thermoelectric modules are packaged between metallized ceramic plates to afford optimum electrical insulation and thermal conduction with high mechanical strength in compression. Thermoelectric modules can be mounted in parallel to increase the heat transfer effect or can be stacked in multistage cascades to achieve high differential temperatures. Solid state cooling is relatively simple compared to some of the classical technique using a compressor because there are no moving parts. These devices have the capability to be either heating systems or cooling systems depending on the direction of the current. Thermoelectric modules are divided into a hot side and a cold side, and are typically attached to heat sinks, creating a heat exchanger for use in a TEC.

The present invention is directed to an improved thermoelectric heat exchanger. The thermoelectric heat exchanger may be used for heating or cooling an enclosure of device. The following description focuses on a thermoelectric heat exchanger that is used for cooling. More particularly, the present invention is directed to an improved thermoelectric cooler (TEC), having an improved packaging design, which results in compactness, increased efficiency, and increased reliability. In addition, the TEC has an improved power control circuit. Also, the TEC is sealed to minimize moisture penetration into the thermoelectric modules and electrical components for increased reliability. The hot side of the TEC is sealed from the cold side of the TEC to increase efficiency. Preferably, the TEC includes spacing between the hot side heat sink and cold side heat sink, and also insulation to increase thermal isolation, thereby increasing efficiency. The TEC is designed to exhaust the heat generated from electrical components to the hot side of the TEC to minimize the amount of parasitic load and improve TEC efficiency. The TEC is designed with a DC to DC active power supply to minimize size and reduce waste heat. The TEC is designed with a programmable power control system to maximize cooling for a given design and operating conditions.

The present invention is directed to an improved TEC system having increased moisture resistance. The thermoelectric modules and the electrical components of the power supply assembly are sealed from moisture to become moisture resistant and therefore, provide increased reliability. Moisture resistant means that zero or substantially zero moisture will pass through a particular barrier. The barrier may be around the thermoelectric modules, around the electrical components, and/or between the hot side and the cold side. By making the TEC system moisture resistant, the long term reliability and performance of the system may be improved by minimizing any damage from moisture. The improved sealing of thermoelectric modules is achieved through the use of one or more of a sealing frame, sealant, and blind fastener holes. The improved sealing of electrical components is achieved through the use of one or more of a power pack cover, a cover seal, a gasket, and a sealant.

The TEC is designed to be moisture resistant between the hot side and the cold side. Moisture resistant means that zero or substantially zero moisture will pass a between the hot side and the cold side of the TEC. By making the TEC system moisture resistant, the long term reliability and performance of the system may be improved by decreasing the amount of heat loss between the hot side and cold side. It may also improve the reliability of the TEC by minimizing any moisture on the hot side (e.g. from the environment, washdowns, etc.) from reaching the cold side, which minimizes the potential for moisture to reach the thermoelectric modules or electrical components. Moisture resistance can be further increased by minimizing the number of openings from the hot side to the cold side of the TEC. Also, the number of wires that pass between the hot side and the cold side of the TEC can be minimized, further reducing the chance of moisture flow. The TEC is made moisture resistant by sealing all passages between the hot side and cold side of the TEC.

The present invention includes a TEC having increased thermal efficiency. Increased thermal isolation between the hot side and the cold side of the TEC improves thermal efficiency. Thermal isolation is increased by completely sealing all passages between the hot side and cold side of TEC. Thermal isolation is further increased by separating the cold side heat sink and the hot side heat sink using spacers to minimize any thermal short circuiting between the hot side heat sink and the cold side heat sink. Additionally, thermal isolation is increased by adding insulation between the cold side heat sink and the hot side heat sink.

Thermal efficiency is also increased by designing the system with heat producing electrical components being mounted on a power pack heat sink, which exhausts heat to the hot side of the TEC. Therefore, the heat generated from the heat producing components is dissipated directly to the hot side of the TEC. This configuration allows the heat producing components to be cooled by ambient air without decreasing the amount of cooled air available for cooling of the load. Additionally, by keeping electrical components together, this configuration minimizes the amount of wiring that passes through wire feed openings. Decreasing the amount of wiring passing through an opening makes it simpler to seal, thereby, increasing moisture resistance and helping to increase thermal isolation.

The present invention includes a compact design by utilizing a DC to DC active power supply with an input of a simple filter/rectifier circuit. This avoids the use of a conventional transformer, which would require more space and would create more waste heat. The use of a DC to DC active power supply with a flat, compact profile, decreases the overall size of the TEC and simplifies the sealing of the electrical components. This design provides a compact TEC, which is more efficient and easier to seal than a TEC utilizing a typical transformer design as part of the power supply assembly. This design also provides the compactness required, while still allowing mounting of other components in the housing, for example, the fans.

The present invention also includes a power control circuit that maximizes cooling for a given design by sensing and monitoring the temperature difference between the hot side of the thermoelectric modules and the hot side of the TEC (ambient temperature). The power output to the thermoelectric modules is varied based on the sensed temperature difference, thereby improving the performance of the TEC.

Referring now to the accompanying drawings, FIG. 1 shows an exemplary TEC 1. As shown in FIG. 1, the TEC 1 includes a housing 2 having a cold side cover 3, a hot side cover 4, and a mounting frame 5. The mounting frame 5 is positioned between cold side cover 3 and hot side cover 4. Cold side cover 3 is attached to mounting frame 5 and covers the components on a cold side 7 of the TEC 1. Hot side cover 4 is attached to mounting frame 5 and covers the components on a hot side 8 of TEC 1.

As shown, mounting frame 5 is substantially rectangular in shape and includes a substantially planar body 10. A mounting flange 14 may be formed over the outer periphery of at least two sides of the planar body 10 of mounting frame 5 and that extend outside of the housing 2. A plurality of through holes 11 may be formed in mounting flange 14 for mounting the TEC 1 to an enclosure (not shown) or other device to be cooled. The mounting frame 5 also includes a plurality of through holes 12, corresponding to through holes 28 in the cold side cover 3 and the hot side cover 4 for mounting both cold side cover 3 and hot side cover 4 to mounting frame 5.

Cold side cover 3 includes a substantially planar body 20 having four side walls 22 extending from a peripheral edge 23 of the planar body 20. The four side walls 22 extending from a peripheral edge 23 of the planar body 20 define a cold side cavity 24. At least one side wall 22 includes an opening allowing air to access the cold side cavity 24. Preferably, one side wall 22 includes a bottom opening 25. Cold side cover 3 includes at least two mounting brackets 26, which extend outward from a distal end 27 of at least two opposite side walls 22. Preferably the mounting brackets 26 extend outward in a direction that is substantially perpendicular to the side walls 22. Alternatively, the cold side cover 3 may include four mounting brackets 26, one extending outward from each of the side walls 22. The mounting brackets 26 include a plurality of through holes 28 for receiving fasteners 29 for mounting the cold side cover 3 to the mounting frame 5. Preferably, cold side cover 3 is stainless steel. Alternatively, cold side cover 3 may be steel, light weight plastic composite, or any other suitable material.

As shown in FIG. 1, cold side cover 3 includes one or more openings. An adjustment thermostat opening 35 is provided for mounting an adjustment thermostat control knob 36. The adjustment thermostat control knob 36 is appropriately connected to an adjustment thermostat (not shown) to allow an operator to adjust the temperature setpoint of the TEC 1. A circuit breaker opening 38 is provided for mounting an over current circuit breaker 39. Over-current circuit breaker 39 will trip on an over-current condition. A power cord opening 40 is provided for allowing a power cord 41 to penetrate the cold side cover 3.

A fan opening 45 is provided for the mounting of cold side fan 46. Cold side fan 46 is mounted to cold side cover 3 proximate to fan opening 45. Alternatively, a plurality of fan openings 45 and cold side fans 46 may be included in the cold side cover 3. Cold side fan 46 forces air through the fan opening 45, across the cold side 7 of the TEC 1, and out of the bottom opening 25. Alternatively, cold side fan 46 may force air into the bottom opening 25, across the cold side 7 of TEC 1, and out fan opening 45.

In a typical mounting to an enclosure, cold side cover 3 extends into the enclosure and hot side cover 4 extends outside of the enclosure. Preferably, bottom opening 25 is mounted facing downward or toward the ground to protect the TEC from water, chemicals, and dust. The TEC 1 may include a gasket (not shown) for sealing between the TEC and an enclosure (not shown). The gasket is substantially planar and adapted to the size of mounting flange 14. The gasket is disposed between the mounting flange 14 and the enclosure. Preferably, the gasket is water and oil resistant neoprene. Sealing screws (not shown) are disposed in through holes 11 to secure the mounting flange 14 to the enclosure. The use of a gasket and sealing screws provide moisture resistance between the cold side 7 and the hot side 8 when the TEC 1 is installed in an enclosure.

Figure 2:
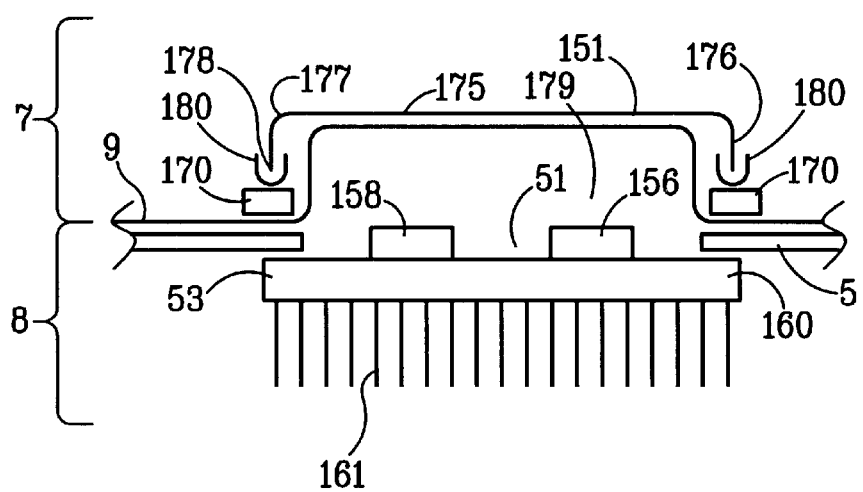
FIG. 2 is a cross sectional view of the TEC in of FIG. 1.

FIG. 2 is a cross sectional view of an exemplary TEC 1 showing the barrier 9 between the cold side 7 and the hot side 8. Mounting frame 5 includes power pack cutout 51. Power pack heat sink 53 includes a base portion 160 having with a plurality of fins 161 extending from one side of the base portion 160. Power pack heat sink 53 is mounted, proximate to power pack cutout 51, on the hot side 8 of mounting frame 5, with the base portion 160 proximate to the mounting frame 5. Gasket 170 is attached to the cold side 7 of the mounting frame 5 proximate to the power pack cutout 51. Power pack cover 151 includes a base 175 having four sides 176 extending from a peripheral edge 177 of the base 175 to an outer edge 178. The base 175 and sides 176 define a cavity 179. Power pack cover 151 may have a cover seal 180 disposed over the outer edge 178. Preferably, power pack cover 151 is secured to gasket 170 with cover seal 180 proximate to the gasket 170. Electrical components 155, 156, 157, and 158 (155 and 157 not shown) are mounted to the base portion 160 of the power pack heat sink 53 and protrude through power pack cutout 51 in mounting frame 5 into cavity 179. Cavity 179 has a length of about 4 inches, a width of about 5 inches, and a height of about 3 inches. Mounting frame 5, gasket 170, and power pack cover 151 define a non-planar barrier 9 between a cold side 7 and a hot side 8. Cavity 179 is on the hot side 8 of barrier 9. This non-planar barrier 9 allows electrical components to be disposed into cavity 179, allowing room for other components to be mounted in the housing 2.

Figure 3:
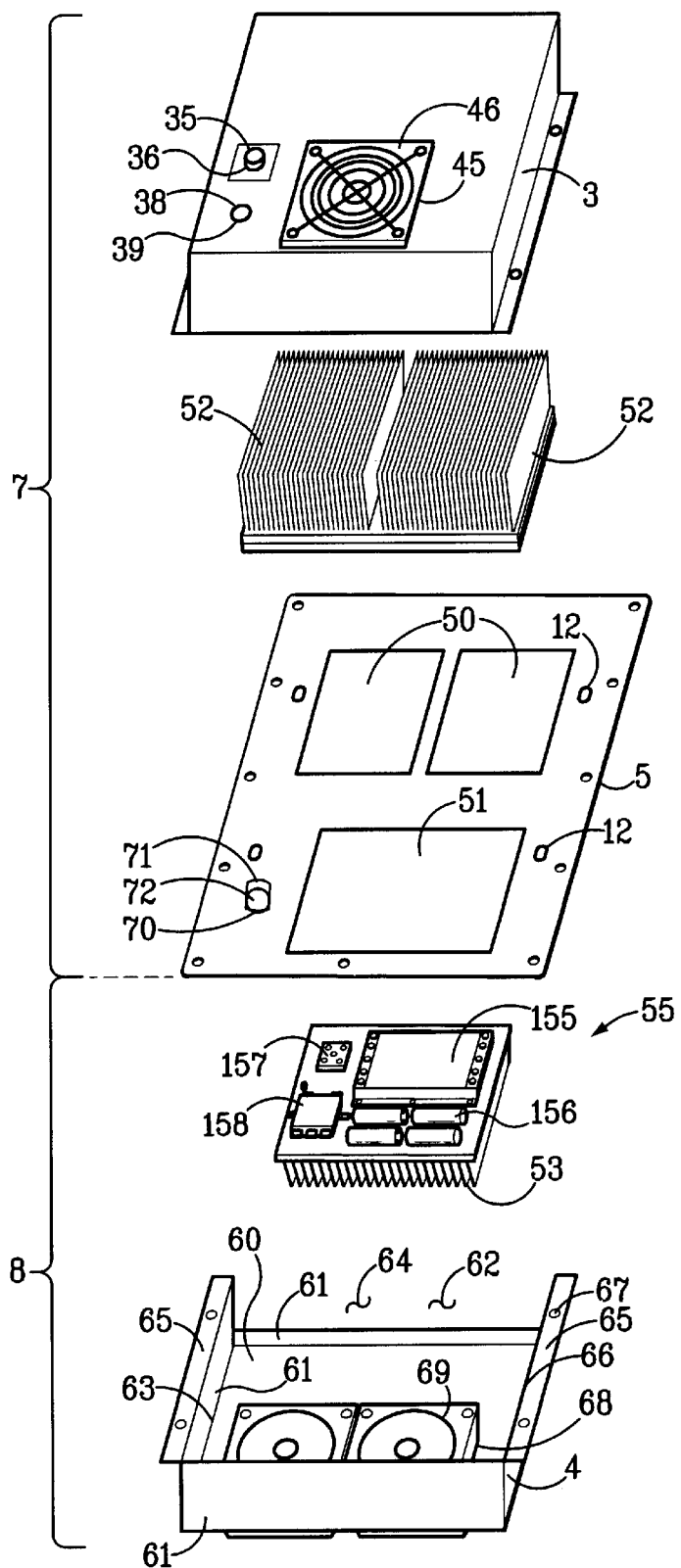
FIG. 3 is an exploded perspective view of the TEC of FIG. 1.

FIG. 3 shows the interior of the housing 2 of FIG. 1. As shown in FIG. 3, the housing 2 includes a mounting frame 5, a cold side cover 3, and a hot side cover 4. Mounting frame 5 includes at least one, preferably two, heat sink cutouts 50, and at least one power pack cutout 51. As shown, the mounting frame 5 includes two heat sink cutouts 50 one power pack cutout 51. Mounting frame 5 is located between the cold side 7 and the hot side 8. The cold side 7 includes cold side heat sinks 52. Cold side heat sinks 52 are attached on the cold side 7 of mounting frame 5. The hot side 8 includes power pack heat sink 53 and at least one, preferably two, hot side heat sinks 54. Hot side heat sinks 54 (shown in FIG. 3) are attached on the hot side of mounting frame 5. Power pack heat sink 53 is attached on the hot side of mounting frame 5.

Power supply assembly 55 may include power pack heat sink 53, and a plurality of electrical components including a DC to DC active power supply 155, one or more filter capacitors 156, a bridge rectifier 157, and a noise suppression filter 158, and associated circuitry (not shown).

Hot side cover 4 includes a substantially planar body 60 having four side walls 61 extending from a peripheral edge 63 of the planar body 60. The four side walls 61 extending from a peripheral edge 63 of the planar body 60 define a hot side cavity 62. At least one side wall 61 includes an opening allowing air to access the hot side cavity 62. Preferably, one side wall 61 includes a bottom opening 64. Hot side cover 4 includes at least two mounting brackets 65, which extend outward from an end 66 of at least two opposite side walls 61. Preferably, the mounting brackets 65 extend outward in a direction that is substantially perpendicular to the side walls 61. Alternatively, the hot side cover 4 may include four mounting brackets 65, one extending outward from each of the side walls 61. The mounting brackets 65 includes a plurality of through holes 67 for receiving fasteners (not shown) for mounting the hot side cover 4 to the mounting frame 5. Mounting frame 5 includes through holes 12 corresponding to through holes 67 of hot side cover 4. Fasteners (not shown) are disposed through through holes 12 and through holes 67 to secure hot side cover 4 to mounting frame 5. Preferably, hot side cover 4 is made of stainless steel. Alternatively, hot side cover 4 may be steel, light weight plastic composite, or any other suitable material.

Figure 4:
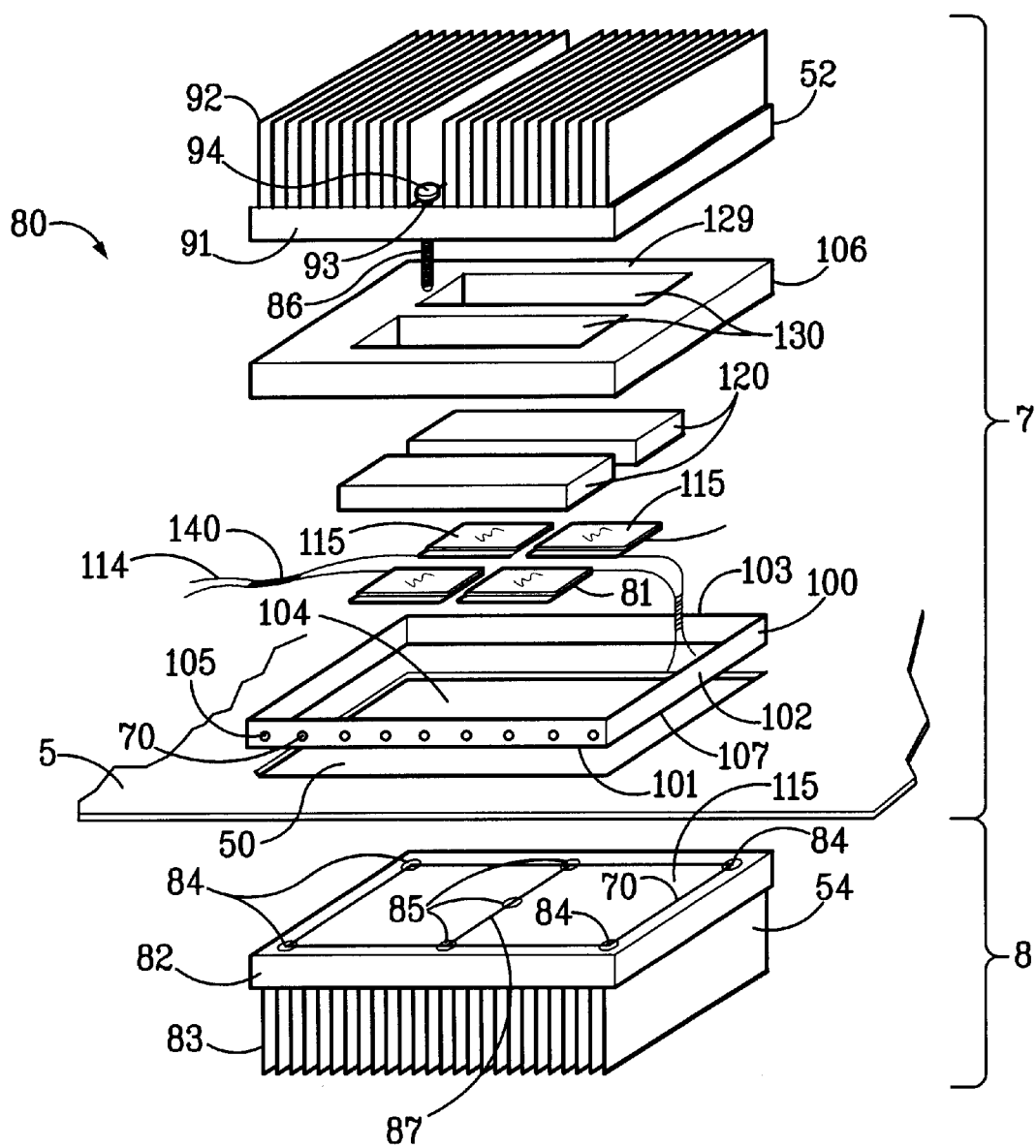
FIG. 4 is an exploded perspective view of an exemplary heat exchanger in accordance with the present invention.

Hot side cover 4 includes one or more openings. At least one fan opening 68 is provided for the mounting of at least one hot side fan 69. Each hot side fan 69 is mounted proximate to a fan opening 68 in hot side cover 4 and draws air across the power pack heat sink 53 to remove heat. In a preferred embodiment, shown in FIG. 3, there are two fan openings 68 and two hot side fans 69. Hot side fans 69 force air through the fan openings 68, across the hot side 4 of the TEC 1, and out of the bottom opening 64. Alternatively, hot side fans 69 may force air into the bottom opening 64 across the hot side 8 of TEC 1, and out fan opening 68. Hot side heat sinks 54, (which are shown in FIG. 4) are mounted to the hot side of mounting frame 5. Hot side fans 69 also draw air across hot side heat sinks 54 to expel heat to the outside of the enclosure.

A wire feed opening 72 is located in mounting frame 5 and provides access for running wires (not shown) between the hot side 8 and cold side 7. Wires are disposed through the wire feed opening 72 and sealed completely by a liquid tight compression fitting 71 disposed in wire feed opening 72. The liquid tight compression fitting 71 may increase thermal efficiency by preventing moisture and heat from reaching the cold side 7. The liquid tight compression fitting 71 may also increase the life of the TEC 1 by preventing moisture from reaching electrical components 155, 156, 157 and 158, thereby, increasing the life of the electrical components 155, 156, 157 and 158. As shown in FIG. 3, the electrical components include a DC to DC active power supply 155, filter capacitors 156, a bridge rectifier 157, and a noise suppression filter 158, and associated circuitry (not shown). Sealant 70 may be disposed in wire feed opening 72 to further seal the wire feed opening 72.

FIG. 4 is an exploded perspective view of an exemplary heat exchanger 80. As shown in FIG. 4, heat exchanger 80 includes at least one thermoelectric module 81, at least one hot side heat sink 54, and at least one cold side heat sink 52. Preferably there are two hot side heat sinks 54 and two cold side heat sinks 52. Mounting frame 5 includes at least one heat sink cutout 50. Heat sink cutout 50 allows the thermoelectric modules 81 to contact both the hot side heat sink 54 and the cold side heat sink 52. Preferably, there are two heat sink cutouts 50. The contact between hot side heat sink 54 and cold side heat sink 52 provides for heat transfer between the cold side 7 and the hot side 8 allowing the enclosure or device (not shown) to be cooled.

Hot side heat sink 54 includes a substantially rectangular base portion 82 and a plurality of fins 83 extending in a substantially orthogonal direction from the base portion 82. Base portion 82 is solid and substantially rectangular in shape. Fins 83 are substantially planar in shape and are preferably evenly spaced across the base portion 82. The plurality of fins 83 provides more surface area for better heat transfer.

Hot side heat sink 54 is attached to the hot side 8 of mounting frame 5, proximate to heat sink cutout 50 through blind holes 84 and fasteners 86. Hot side heat sink 54 includes a plurality of, preferably four, blind holes 84 located around the perimeter of the base portion 82, opposite the plurality of fins 83. The blind holes 84 provide for attachment to the mounting frame 5 without providing a path for air and moisture. This provides a moisture resistant barrier between the hot side 8 and the cold side 7, increasing thermal isolation and minimizing the risk of moisture reaching the thermoelectric modules 81 or electrical components 155, 156, 157 and 158 (not shown). The use of blind holes 84 also maximizes thermal isolation creating a moisture resistant barrier between the hot side 8 and the cold side 7. Preferably, hot side heat sink 54 is made of extruded aluminum. Alternatively, hot side heat sink 54 is made of aluminum, copper, and/or graphite, if weight is a concern, or any other suitable thermally conductive material.

A sealant 70 is placed around the perimeter of the base 82, between the hot side heat sink 54 and the mounting frame 5 to further seal any gaps, providing moisture resistance and thermal isolation. A preferred sealant 70 is room temperature vulcanized silicone rubber (RTV). This moisture resistance feature functions to increase the long-term reliability of the TEC 1.

Preferably, hot side heat sink 54 also includes a plurality of blind holes 85 located along a centerline 87 of the base 82, opposite the plurality of fins 83. Blind holes 85 are provided to attach the cold side heat sink 52 to the TEC 1 using fasteners 86. The blind holes 84 provide for attachment to the mounting frame 5 without providing a path for air and moisture. This minimizes the risk of moisture passing between the hot side 8 and the cold side 7, increasing thermal isolation and minimizing the risk of moisture reaching the thermoelectric modules 81 or electrical components 155, 156, 157 and 158 (not shown). The use of blind holes 84 also maximizes thermal isolation by not allowing air or moisture to flow between the hot side 8 and the cold side 7.

Sealing frame 100 has a bottom surface 101, one or more outer surfaces 102 extending from a peripheral edge 107 of the bottom surface 101, and a free edge 103 is formed at a distal end of outer surface 102. Bottom surface 101 has a sealing frame opening 104. Sealing frame opening 104 is substantially rectangular and adapted to allow one or more thermoelectric modules 81 to be disposed therein and to contact the hot side heat sink 54 and the cold side heat sink 52. Outer surfaces 102 have a plurality of wire holes 105 to allow access for wires 114. Sealing frame 100 is attached to the cold side 7 of the mounting frame 5, proximate to heat sink cutout 50, with fasteners (not shown) secured into the blind holes 84 of the hot side heat sink 54. The sealing frame 100 provides the ability to seal against the mounting frame 5, to secure insulation 106 in place, and to seal between the sealing frame 100 and the cold side heat sinks 52. A sealant 70 is placed between the sealing frame 100 and the mounting frame 5. A sealant 70 is also disposed between the free edge 103 of the sealing frame 100 and the cold side heat sink 52. Preferably, the sealing frame 100 is constructed of thermoplastic. More preferably, the sealing frame 100 is constructed of fire resistant thermoplastic.

Thermoelectric modules 81 have a relatively flat and planar body and, as shown in FIG. 4, have a substantially rectangular shape. At least two wires 114 are attached to the thermoelectric modules 81. Wires 114 provide a means for applying power to the thermoelectric modules 81. At least one, preferably four, thermoelectric modules 81 are affixed to each hot side heat sink 54, substantially coplanar with the mounting frame 5. Preferably, the four thermoelectric modules 81 are substantially centered within each quadrant of sealing frame opening 104. Preferably, the thermoelectric module 110 is Tellurex (Traverse City, Mich.) model CZ1-1.4-1272. More preferably, the thermoelectric module 110 is Melcor (Trenton, N.J.) model CP1.4-127-0451

Conductive material 115 is disposed on both the hot side 8 and the cold side 7 of the thermoelectric modules 81 to promote good thermal coupling. Preferably, the conductive material 115 is a thermal grease. More preferably, the conductive material 115 is a film phase change material such as manufactured by Furon of New Haven, Conn.

In a preferred embodiment, one or more thermally conductive spacer blocks 120 are placed on the cold side 7 of thermoelectric modules 81. As shown, thermally conductive spacer blocks 120 have a substantially rectangular shape and are constructed of thermally conductive material. As shown in FIG. 4, there are two thermally conductive spacer blocks 120. Preferably, each thermally conductive spacer block 120 is sized to contact two thermoelectric modules 81 and are mounted contacting the two thermoelectric modules 81. Alternatively, there maybe four thermally conductive spacer block 120, each sized to contact one thermoelectric module 81, and each mounted contacting thermoelectric module 81. Conductive material 115 is disposed between the thermoelectric modules 81 and the thermally conductive spacer blocks 120 to increase thermal conductivity. Thermally conductive spacer blocks 120 increase the separation distance between the hot side heat sink 54 and the cold side heat sink 52, reducing thermal losses which may occur from any thermal short circuiting between the hot side heat sink 54 and the cold side heat sink 52. Preferably, thermally conductive spacer blocks 120 are machined blocks of aluminum.

Cold side heat sink 52 includes a substantially rectangular base portion 91 and a plurality of fins 92 extending in a substantially orthogonal direction from the base portion 91. Preferably, base portion 91 is solid and substantially rectangular in shape, as shown in FIG. 4. Fins 92 are substantially planar in shape and preferably are evenly spaced across the base portion 91. The plurality of fins 92 provide more surface area for better heat transfer. Preferably, cold side heat sink 52 is made of extruded aluminum. Alternatively, cold side heat sink 52 is made of aluminum, copper, and/or graphite, if weight is a concern, or any other suitable conductive material.

Cold side heat sink 52 is mounted with base portion 91 proximate to on the thermally conductive spacer blocks 120 on the cold side of mounting frame 5 and with base portion 91 proximate to the free edge 103 of the sealing frame 100. Cold side heat sinks 52 contact the thermally conductive spacer blocks 120. Preferably, conductive material 115 is applied between the thermally conductive spacer blocks 120 and the cold side heat sink 52 to promote thermal transfer. Preferably, cold side sink 52 also includes a plurality of through holes 93 corresponding to blind holes 85 in hot side heat sink 54. Through holes 93 are provided to attach the cold side heat sink 52 to the blind holes 85 of hot side heat sink 54 using fasteners 86. Preferably, the fasteners include sealing washers. This minimizes the risk of moisture passing between the hot side 8 and the cold side 7, increasing thermal isolation and minimizing the risk of moisture reaching the thermoelectric modules 81 or electrical components 155, 156, 157 and 158 (not shown).

Insulation 106 has a substantially rectangular body 129 with one or more insulation openings 130. Insulation 106 has thermally insulating properties. Insulation 106 is disposed between the sealing frame 100 and the cold side heat sink 52 to secure the thermally conductive spacer blocks 120 and to provide increased thermal isolation between the hot side heat sink 54 and cold side heat sink 52. The one or more insulation openings 130 correspond to the number, size, and shape of the thermally conductive spacer blocks 120. As shown in FIG. 4, there are two insulation opening corresponding to size, and shape of two thermally conductive spacer blocks 120. Alternatively, where four thermally conductive spacer blocks 120 are used, there are four insulation opening 130 corresponding in size, and shape to the four thermally conductive spacer blocks 120. Thermally conductive spacer blocks 120 are disposed within insulation openings 130. This design secures the thermally conductive spacers blocks 120 in place and also provides increased thermal isolation between the hot side heat sink 54 and the cold side heat sink 52, by preventing thermal short circuiting between the hot side heat sink 54 and the cold side heat sink 52. Preferably, the insulation 106 is a closed cell fire-resistant foam material.

Thermoelectric module wires 114 run from the thermoelectric modules 81, are secured with wiring constraints 140 and run through wire holes 105 located in sealing frame 100. Wire holes 105 are completely sealed with sealant 70 to increase thermal efficiency and to prevent moisture from reaching the thermoelectric modules 81. Preferably, the wiring constraint 140 is heat shrink tubing. Preferably, the sealant 70 is RTV.

The sealant 70 between mounting frame 5 and sealing frame 100, the sealant 70 between the sealing frame 100 and cold side heat sink 52, the sealant 70 applied to wire holes 105, and the sealant 70 between the hot side heat sink 54 and the mounting frame 5 forms a moisture resistant barrier for the thermoelectric modules 81. Moisture resistance is important during normal operation of the TEC 1. Humid moisture-laden air is drawn through the cold side heat sink 52. Once cooled, the air which may have humidity levels approaching 100% can no longer contain as much moisture as it cools, and the air borne moisture then condenses onto the various cooling system components. Unless moisture is prevented from entering the TEC 1 by thoroughly sealing the thermoelectric modules 81 this moisture may ultimately saturate various locations causing damage to the thermoelectric modules 81 by, for example, chemical degradation, electrolysis, or the like. These sealing features also minimize moisture flow between the hot side 8 and the cold side 7, which improves TEC 1 efficiency.

Figure 5A:
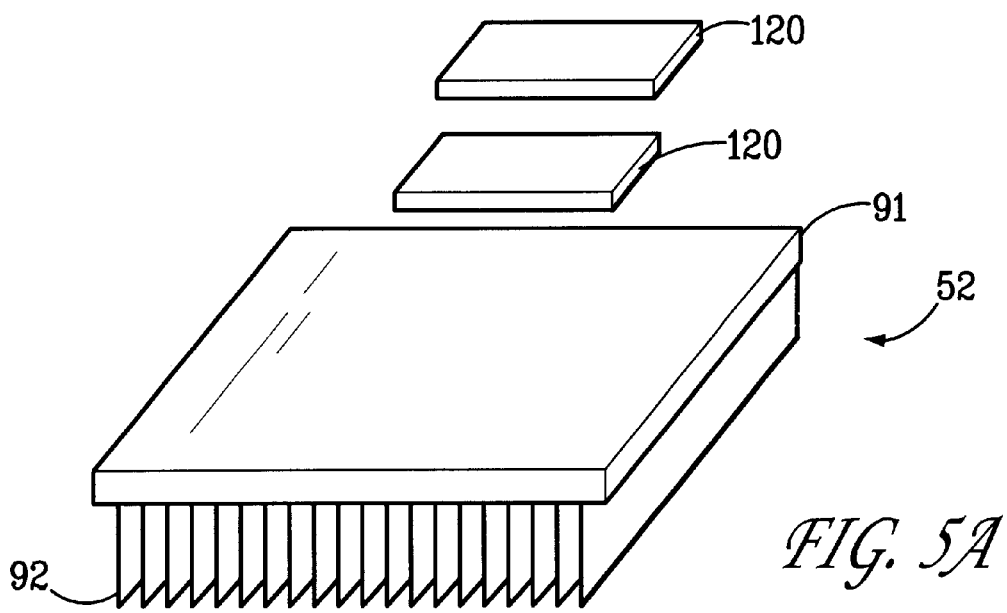
FIG. 5A is a perspective view of an exemplary heat sink in accordance with the present invention.
Figure 5B:
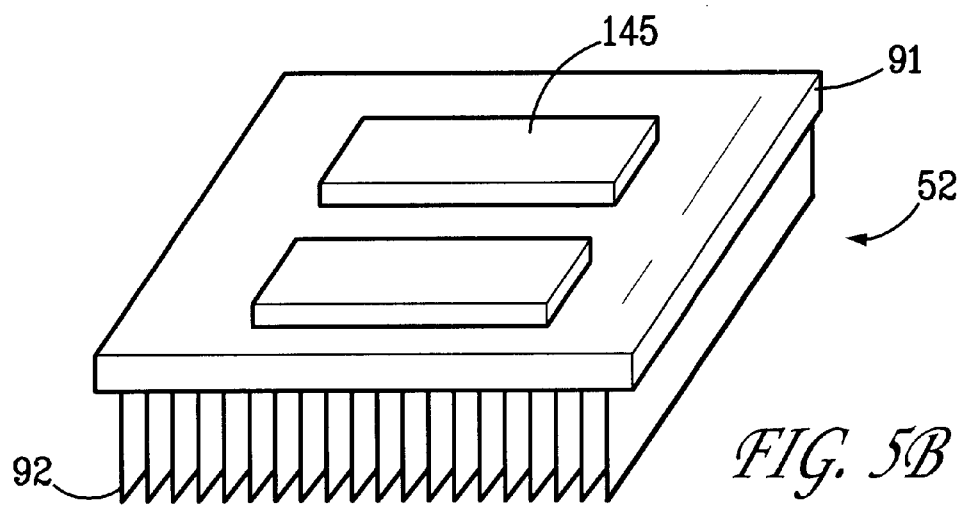
FIG. 5B is a perspective view of an alternative exemplary heat sink in accordance with the present invention.

FIGS. 5A and 5B show exemplary cold side heat sinks 52 for use in the TEC 1. As shown in FIG. 5A, cold side heat sink 52 includes a base portion 91 with a plurality of fins 92 extending therefrom in a substantially orthogonal manner. Base portion 91 is solid and substantially rectangular in shape. Fins 92 are substantially planar in shape, and are preferably spaced evenly apart across the base portion 91.

Preferably, some distance is provided between the hot side heat sink 54 and cold side heat sink 52 to prevent thermal short circuits. Therefore, cold side heat sink 52 utilizes thermally conductive spacer blocks 120 to increase the gap between hot side heat sink 54 and cold side heat sink 52. However, this configuration creates a thermal interface between cold side heat sink 52 and the thermally conductive spacer blocks 120. Each additional thermal interface can reduce system efficiency. As shown in FIG. 5A, the thermally conductive spacer blocks 120 may be formed separate and then disposed on the base portion 91 of cold side heat sink 52.

Alternatively, the thermally conductive spacer blocks 120 may be formed integral with the base portion 91 of cold side heat sink 52, as shown in FIG. 5B. In this embodiment, thermally conductive spacer blocks 120 are formed integral with base portion 91 of cold side heat sink 52, therefore, avoiding one thermal interface. Preferably, cold side heat sink 52 is constructed from extruded and machined aluminum.

Figure 6:
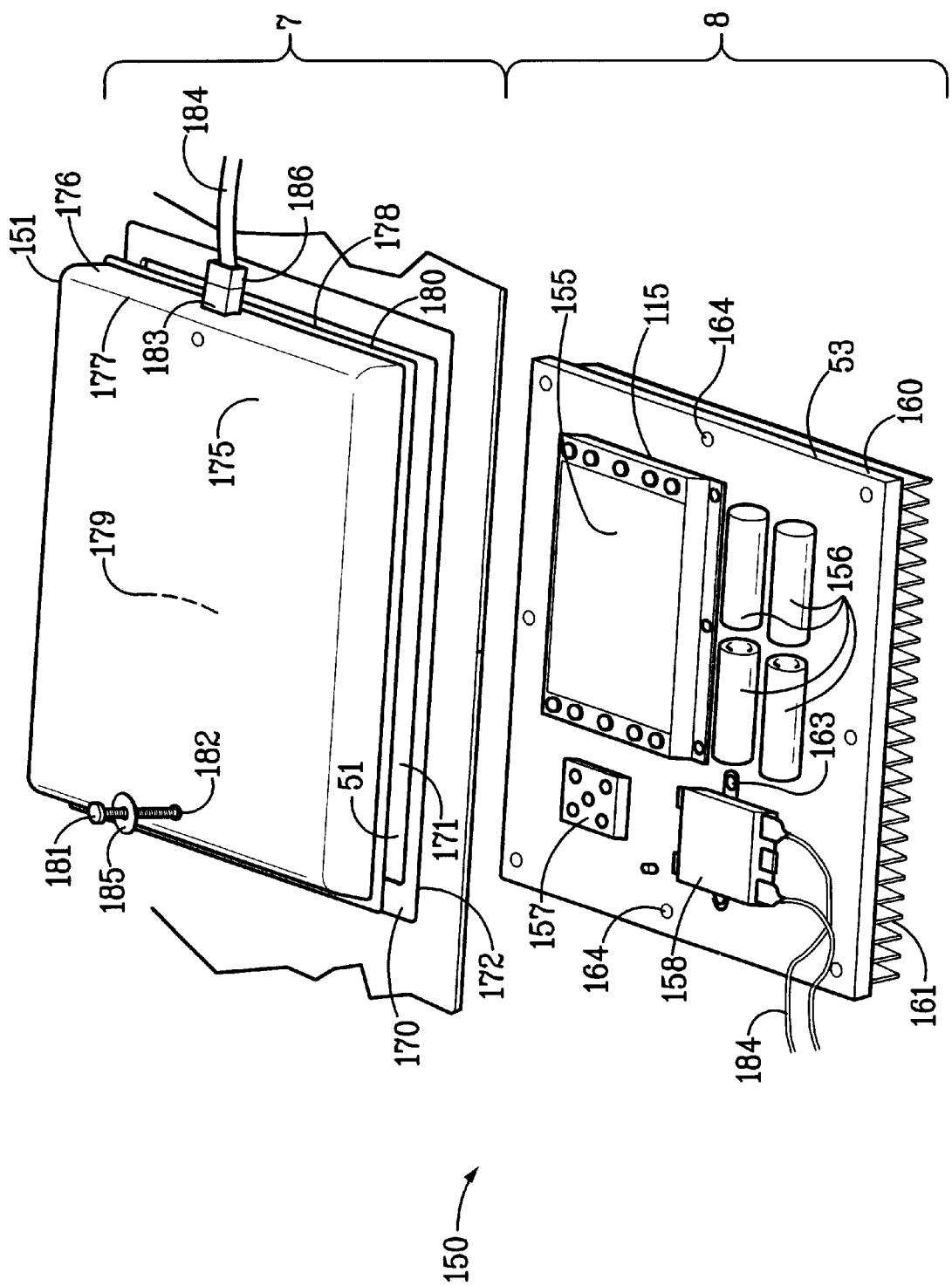
FIG. 6 is a perspective view of an exemplary power pack assembly in accordance with the present invention.

FIG. 6 shows an exemplary power pack assembly 150. As shown in FIG. 6, the power pack assembly 150 includes power pack heat sink 53, power pack cover 151, and a plurality of electrical components 155, 156, 157 and 158. The plurality of electrical components include a DC to DC active power supply 155, filter capacitors 156, a bridge rectifier 157, and a noise suppression filter 158. The power pack assembly 150 also includes associated circuitry (not shown) electrically connecting together the various electrical components.

Power pack heat sink 53 includes a base portion 160 having with a plurality of fins 161 extending from one side of the base portion 160. Base portion 160 is solid and substantially rectangular in shape. Fins 161 are substantially planar in shape. The plurality of fins 161 are attached to base portion 160 in a substantially orthogonal orientation and preferably are evenly spaced apart. The plurality of fins 161 provides more surface area for better heat transfer. Preferably, power pack heat sink 53 is preferably made of extruded aluminum. Alternatively, power pack heat sink 53 is made of aluminum, copper, and/or graphite, if weight is a concern, or any other suitable thermally conductive material.

Power pack heat sink 53 is mounted, proximate to power pack cutout 51, on the hot side 8 of mounting frame 5, with the base portion 160 proximate to the mounting frame 5. Power pack heat sink 53 is mounted on the hot side 8 of mounting frame 5 and draws heat from the electrical components to the hot side 8 of the TEC 1.

Electrical components 155, 156, 157, and 158 are mounted to the base portion 160 of the power pack heat sink 53 and protrude through power pack cutout 51 in mounting frame 5 into cavity 179. Conductive material 115 is disposed between at least one of the electrical components 155, 156, 157 and 158 and the power pack heat sink 53 to improve thermal conduction. The plurality of electrical components 155, 156, 157, and 158 are attached to the base portion 160 of the power pack heat sink 53 with fasteners (not shown) secured into blind holes 163 in the power pack heat sink 53. This attachment enables heat transfer from the electrical components 155, 156, 157, and 158 through the base portion 160 of power pack heat sink 53 to the plurality of fins 161, for forced convection heat removal by hot side fans 60 which move air across the fins 161. The use of blind holes 163 improves the moisture resistance to the electrical components 155, 156, 157, and 158 by not providing a pathway for moisture to reach the electrical components. The use of blind holes 163 increases the thermal isolation of the TEC 1 by not allowing a path for air to travel between the hot side 8 and the cold side 7 of the TEC 1.

Gasket 170 is substantially planar in shape and includes a substantially rectangular opening 171. The opening 171 is adapted to correspond to the size of power pack cutout 51. The gasket 170 is attached to the cold side 7 of the mounting frame 5 proximate to the power pack cutout 51 with adhesive 172. Gasket 170 provides increased moisture resistance by improving the seal between power pack cover 151 and the mounting frame 5. Preferably, gasket 170 is ¼" thick neoprene.

Power pack cover 151 includes a base 175 having four sides 176 extending from a peripheral edge 177 of the base 175 to an outer edge 178. The base 175 and sides 176 define a cavity 179. Power pack cover 151 has a cover seal 180 disposed over the outer edge 178, which when assembled, contacts the gasket 170 to provide increased thermal isolation and to prevent moisture from reaching the electrical components 155, 156, 157, and 158. It also helps prevent moisture flow between the cold side 7 and the hot side 8. Preferably, cover seal 180 is a U-shaped seal that wraps around the outer edge 178 of the power pack cover 151. Power pack cover 151, including cover seal 180, is secured to gasket 170 with fasteners 181 and through holes 182. Fasteners 181 are disposed through a plurality of through holes 182 in power pack cover 151 and are secured to blind holes 164 in power pack heat sink 53. Fasteners 181 can include a sealing washer 185 between the fastener 181 and the power pack cover 151. The use of blind holes 164 maximizes thermal isolation and moisture resistance by not allowing air or moisture to flow between the hot side 8 and the cold side 7.

Preferably, wires 184 are run from the cavity 179 of the power pack cover 151 to the outside of the cavity 179 by being disposed between the power pack cover 151 and the gasket 170. This allows wires 184 to be run to the electrical components 155, 156, 157, and 158. Keeping electrical components 155, 156, 157, and 158 within the cavity 179 of power pack cover 151 minimizes the wiring between hot side 8 and cold side 7 by keeping all interconnections between electrical components inside the cavity 179. Minimizing the number of wires between the hot side 8 and the cold side 7 may increase moisture resistance between the hot side 8 and cold side 7 by making it simpler to seal the wiring that runs between the hot side 8 and cold side 7. Moisture resistance is provided by compression of the wiring between the power pack cover seal 180 and the gasket 170.

Alternatively, wire opening 183 is provided in power pack cover 151 to allow wires 184 to be run to the electrical components 155, 156, 157, and 158. Preferably, the wire opening 183 is also sealed with a liquid tight compression fitting 186. Alternatively, wire opening 183 is sealed with a sealant 70.

A moisture resistant barrier for the electrical components is formed by the sealant 70 between the power pack heat sink 53 and the mounting frame 5, the gasket 170 attached to the cold side 7 of the mounting frame 5 proximate to the power pack cutout 51, the power pack cover 151 including a base 175 having four sides 176 extending from a peripheral edge 177 of the base 175 to an outer edge 180, and the power pack cover 151 being secured to the gasket 170, and the cover seal 180 disposed over the outer edge 180 of the power pack cover 151.

As shown in the previous Figures, a thermal barrier between the cold side 7 and the hot side 8 is formed by the gasket 170 attached to the cold side 7 of the mounting frame 5 proximate to the power pack cutout 171, the power pack cover 151 including a base 175 having four sides 176 extending from a peripheral edge 177 of the base 175 to an outer edge 178, and the power pack cover 151 being secured to the gasket 170, the cover seal 180 disposed over the outer edge 178 of the power pack cover 151, the sealing frame 100 having a bottom surface 101, an outer surface 102 extending from a peripheral edge of the bottom surface 101, and a free edge 103 formed at a distal end of the outer surface 100, a sealing frame opening 104 in the bottom surface 101, wherein the sealing frame 100 is mounted on the cold side 7 of the mounting frame 5 proximate to the heat sink cutout 50, a sealant 70 between the sealing frame 100 and the mounting frame 5, a sealant 70 between the free edge 103 of the sealing frame 100 and the cold side heat sink 52, a sealant 70 between the hot side heat sink 54 and the mounting frame 5, and a sealant 70 between the power pack heat sink 53 and the mounting frame 5.

Figure 7:
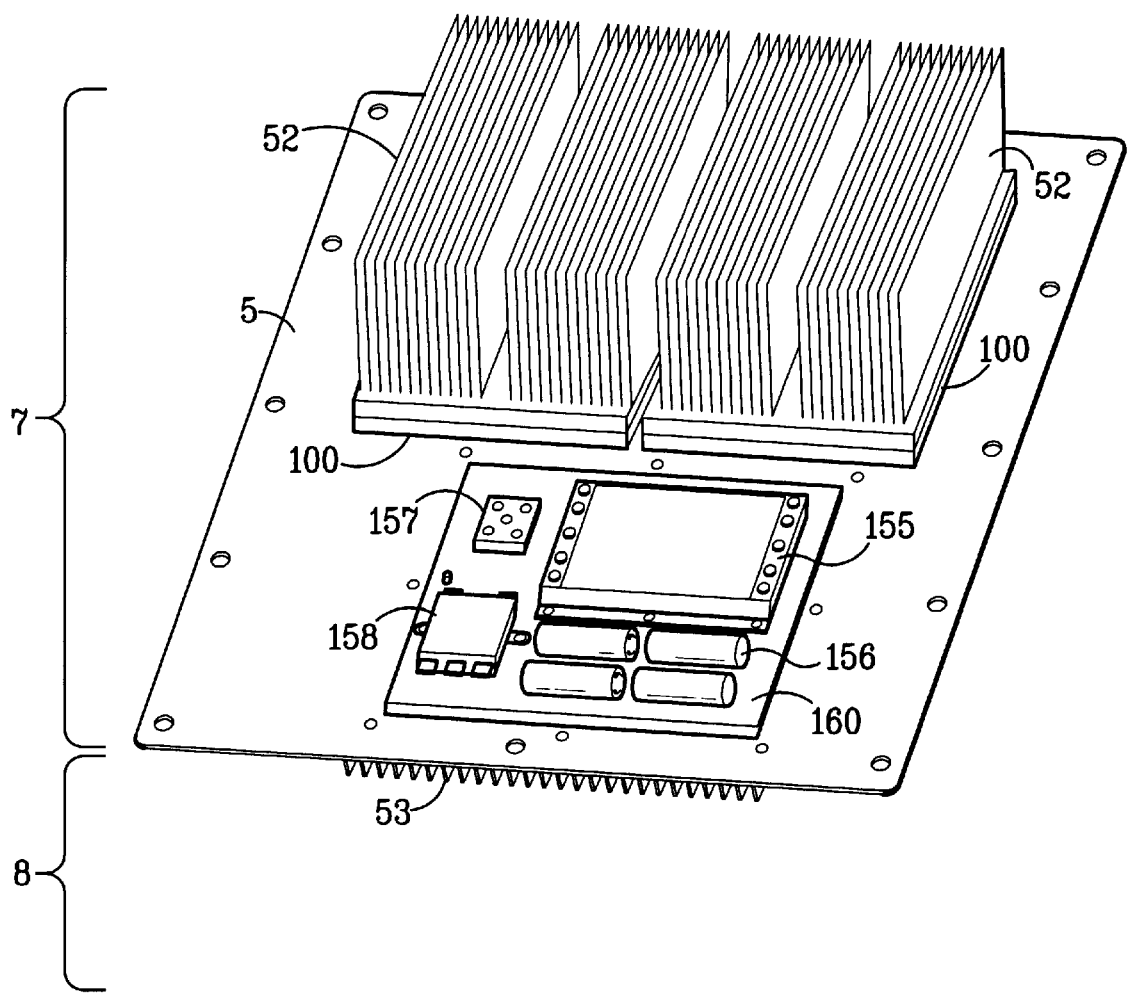
FIG. 7 is a perspective view of an exemplary power pack assembly and heat sinks mounted on a mounting frame in accordance with the present invention.

FIG. 7 shows a partial assembly of the exemplary TEC 1. As shown in FIG. 7, two sealing frames 100 are disposed on the cold side 7 of mounting frame 5, proximate to heat sink cutouts (not shown). Two cold side heat sinks 52 are disposed on the cold side 7 of mounting frame 5, with sealing frame 100 between the cold side heat sinks 52 and the sealing frames 100. Power pack heat sink 53 is disposed on the hot side 8 of mounting frame 5, proximate to power pack cutout (not shown). Electrical components 155, 156, 157, and 158 are attached to the base portion 160 of the power pack heat sink 53.

Figure 8:
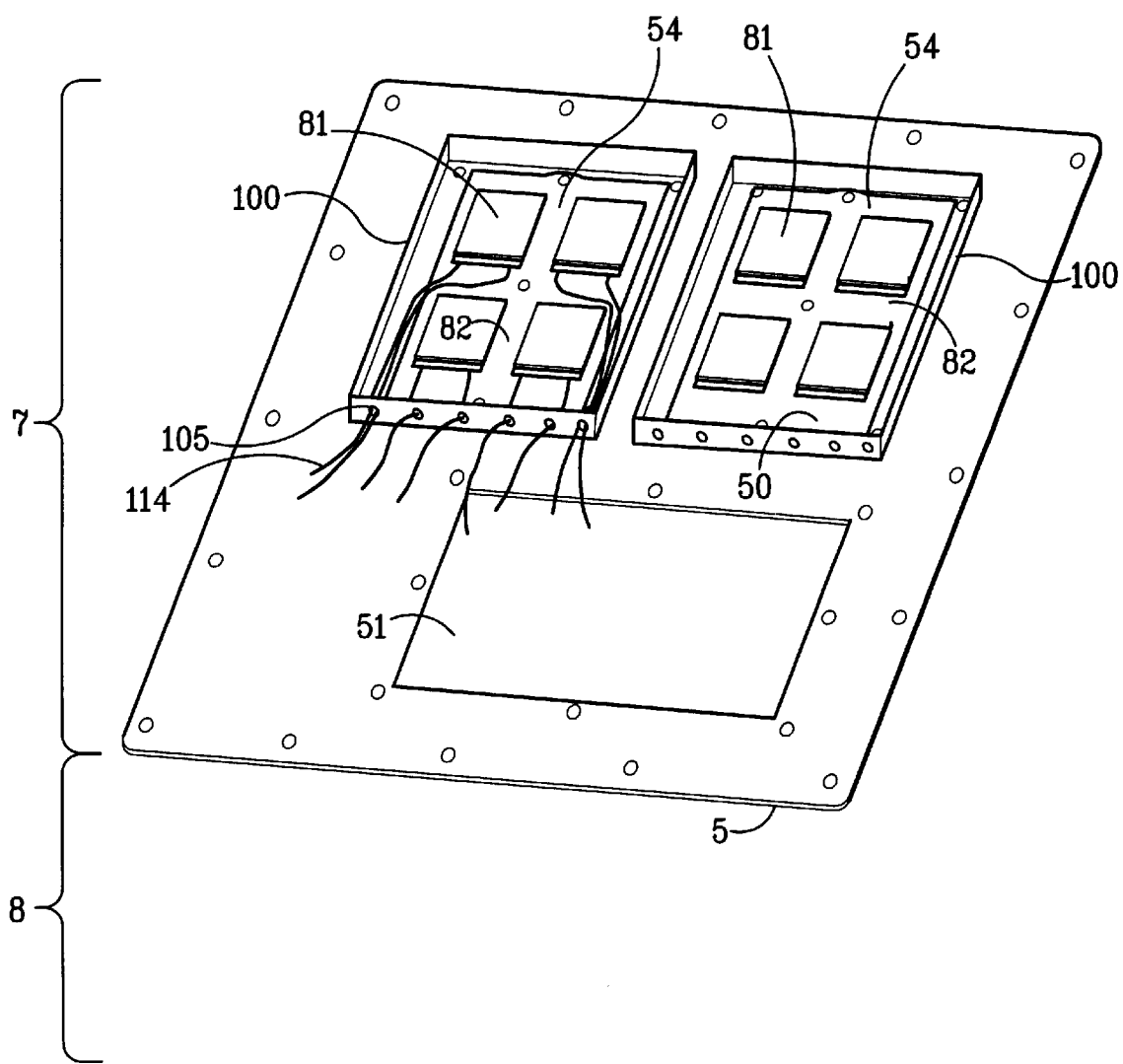
FIG. 8 is a perspective view of exemplary thermoelectric modules mounted on heat sinks in accordance with the present invention.

FIG. 8 shows a partial assembly of the exemplary TEC 1. As shown in FIG. 8, two sealing frames 100 are disposed on the cold side 7 of mounting frame 5, proximate to heat sink cutouts 50. Two hot side heat sinks 54 are disposed on the hot side 8 of mounting frame 5, proximate to heat sink cutouts 50. As shown in FIG. 8, four thermoelectric modules 81 are disposed on the base portion 82 of each hot side heat sinks 54. Thermoelectric module wires 114 run from the thermoelectric modules 81 through wire holes 105 located in sealing frame 100.

Figure 9:
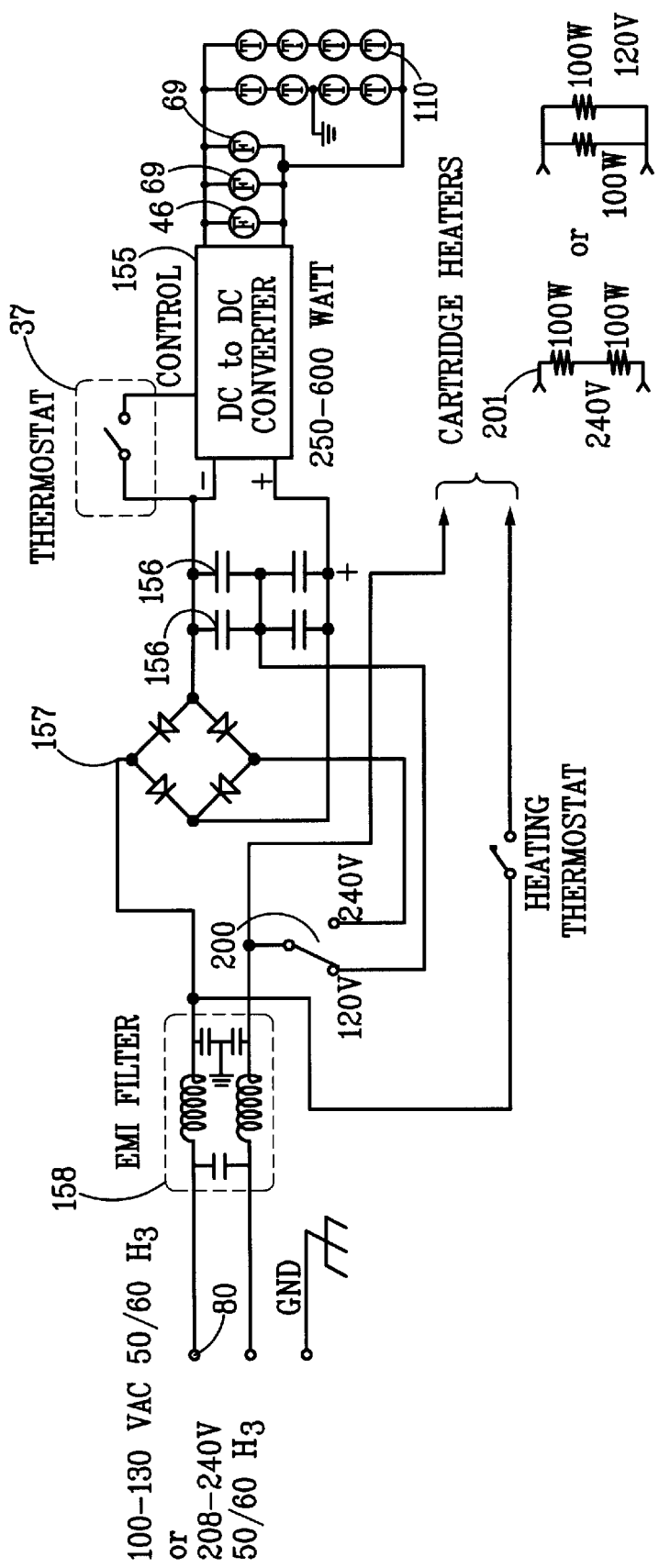
FIG. 9 is a schematic diagram of an exemplary electrical system in accordance with the present invention.

FIG. 9 illustrates an exemplary circuit diagram for TEC 1. As shown in FIG. 9, 100–130 VAC or 208–240V power enters on terminals 80 and passes through noise suppression filter 158. Noise suppression filter 158 reduces noise, which is generated in the DC to DC active power supply 155, from being passed back to the power system supplying the TEC 1. A preferred filter is Delta 05 DBAG5.

Power then passes through solid state bridge 157 to rectify the power. Rectified power is then input to capacitors 156 through a switch 200 to select between 120V and 240V power. Preferably, the capacitors 156 are Illinois capacitor rated at 200V, 470 uFd.

The capacitors 156 output DC power to the DC to DC active power supply 155. As shown in FIG. 9, the output of the DC to DC active power supply 155 is then electrically connected to the hot side fans 69, the cold side fans 46, and thermoelectric modules 81.

The DC to DC active power supply 155 is a compact, substantially rectangular and relatively flat power supply as compared to conventional power supplies. The DC to DC active power supply 155 has a body with a length, and width, and a height. The DC to DC active power supply 155 is a high frequency switched power supply inputting DC power and outputting regulated DC power. The DC to DC active power supply 155 has a compact body. Preferably, the DC to DC active power supply 155 is Vicor (Andover, Md.) model V300A28C500AL. Another preferred DC to DC active power supply is RO Associates Microverter model MV300-28. (Sunnyvale, Calif.) Preferably, the DC to DC active power supply 155 has a length of about 4 inches, a width of about 5 inches, and a height of about 3 inches. More preferably, the DC to DC active power supply 155 has a length of about 3⅝ inches, a width of about 2½ inches, and a height of about ¾ inch. Most preferably, the DC to DC active power supply 155 has a length of about 2.2 inches, a width of about 4.6 inches, and a height of about 0.6 inch.

The DC to DC active power supply 155 is an inverter circuit designed for operation at a very high frequency (i.e.: greater than 300,000 Hz). Operation at this rate allows the isolation transformers to be physically small. For example, a conventional 60 Hz 600 watt transformer for a linear power supply would have a length of about 5.6 inches, a width of about 2½ inches, a height of about ¾ inch and weigh approximately between 15–20 lbs. The transformer required for use with the DC to DC active power supply 155 (operating at 500,000 to 1,000,000 Hz) provides the necessary electrical isolation and reduces the size to a length of about 3⅝ inches, a width of about 2½ inches, and a height of about ¾ inch, with a weight of only a few ounces. Therefore, utilizing the active DC to DC active power supply 155, it is possible to build TEC 1 in much smaller and lighter packages. Additionally, because of the flatness of the DC to DC active power supply 155, the housing 2 (shown in FIG. 1) may include other components, for example, hot side fan 69 (shown in FIG. 3).

Adjustment thermostat 37 is electrically connected to DC to DC active power supply 155 and to a thermal sensing element (not shown) on the cold side 7 of the housing 2. Adjustment thermostat 37 senses the temperature on the cold side 7 of the housing by sensing an electrical parameter of the thermal sensing element. Adjustment thermostat 37 then enables or disables the to DC to DC active power supply 155 accordingly. Preferably, the adjustment thermostat 37 is a bimetallic thermostat with setpoint capacity. More preferably, the adjustment thermostat 37 is a solid state sensor with setpoint capacity.

In an alternate embodiment, the 120V or 240V power is wired to an optional cartridge heater 201. A preferred cartridge heater 201 includes two 100 W heaters. If 120V power is selected on switch 200 supplied, the cartridge heater 201 is electrically connected as two 100 ohm resistors in parallel. If 240V power is selected on switch 200, the cartridge heater 201 is electrically connected as two 100 ohm resistors in series. Cartridge heater 201 helps drive moisture out of the hot side 8 of the TEC 1, which may further increase reliability and/or component longevity. This may be especially important during cold periods, when condensation occurs more frequently.

Figure 10A:
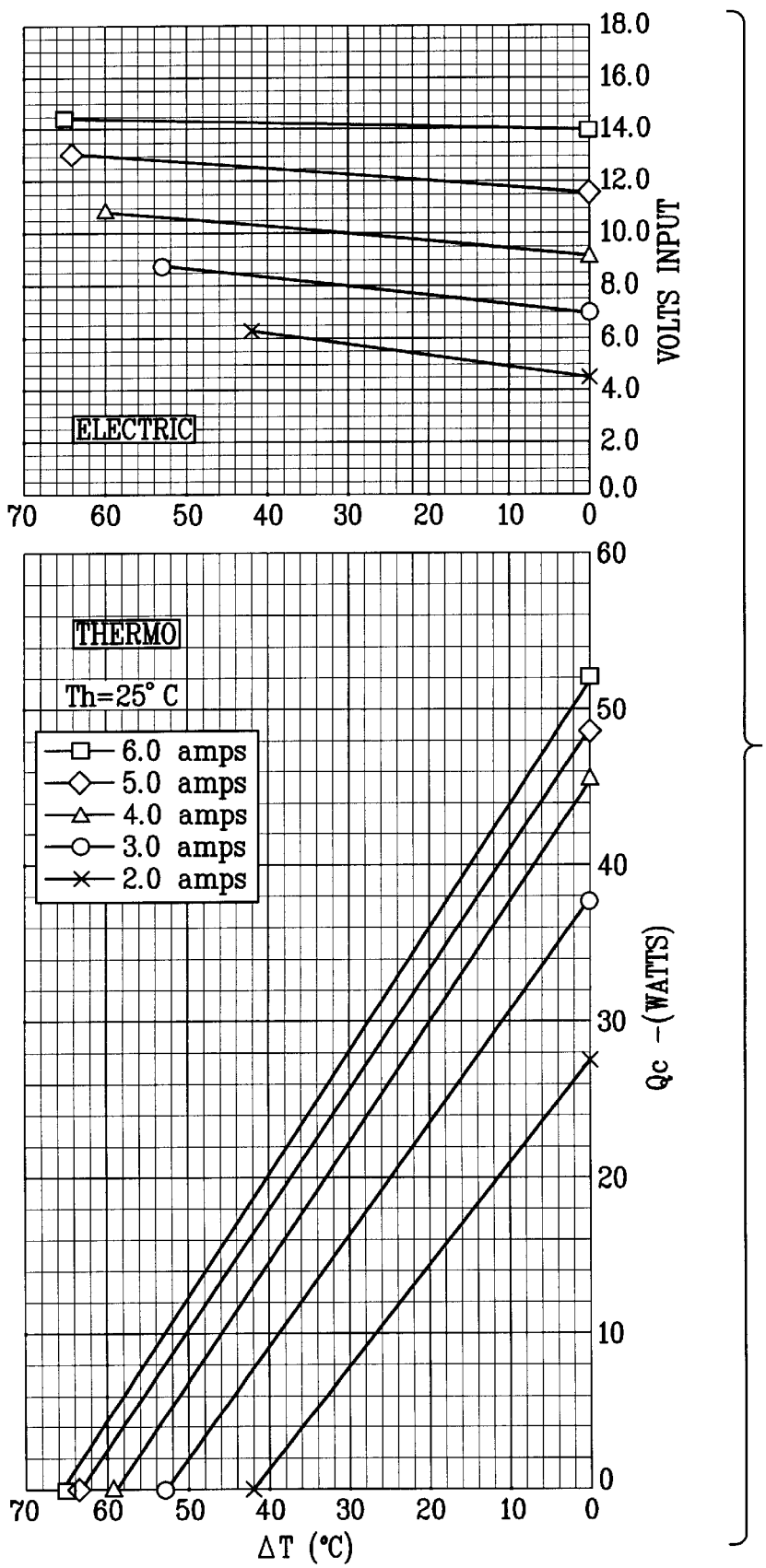
FIGS. 10A, 10B, and 10C show exemplary performance graphs for an exemplary thermoelectric module in accordance with the present invention.
Figure 10B:
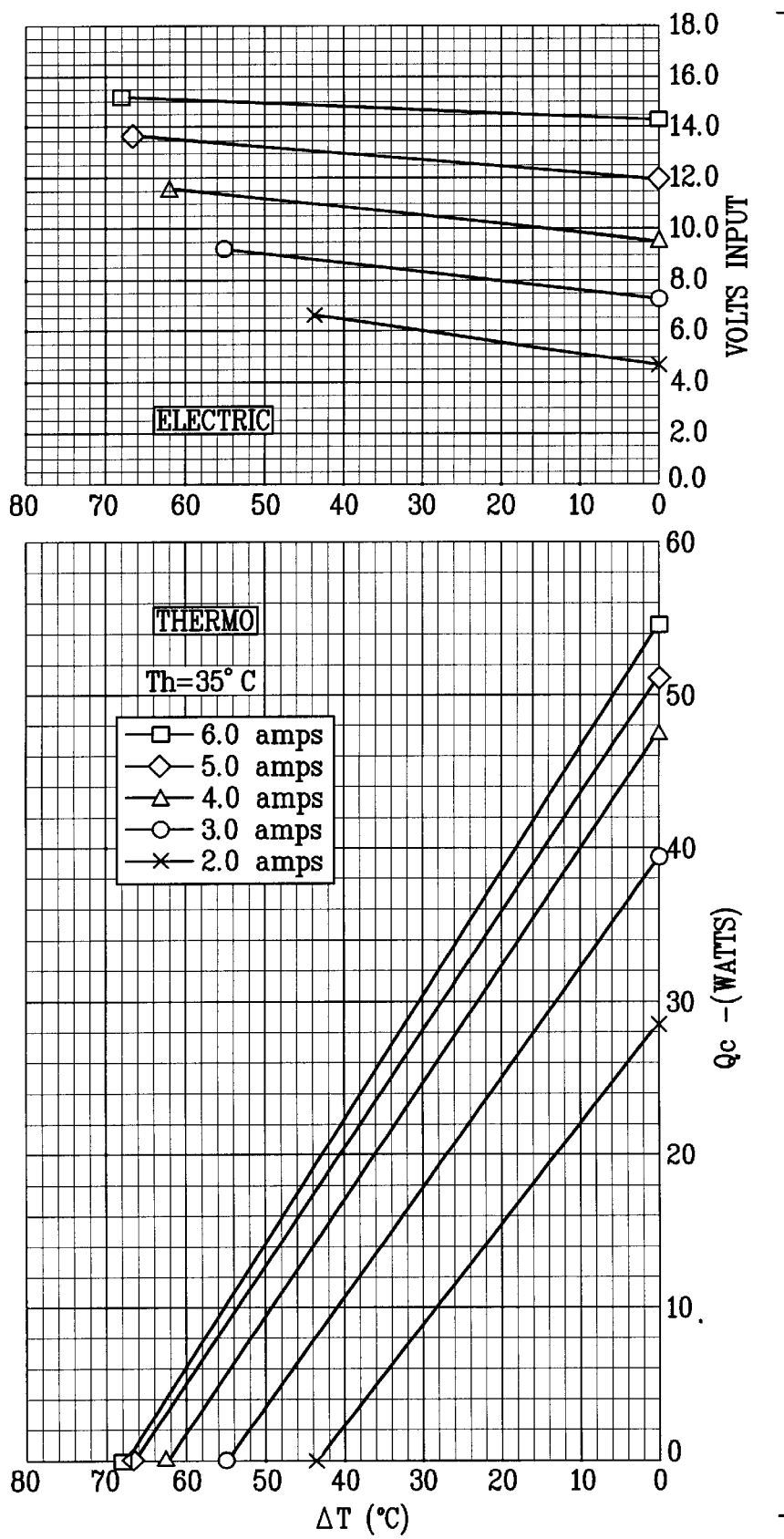
Figure 10C:
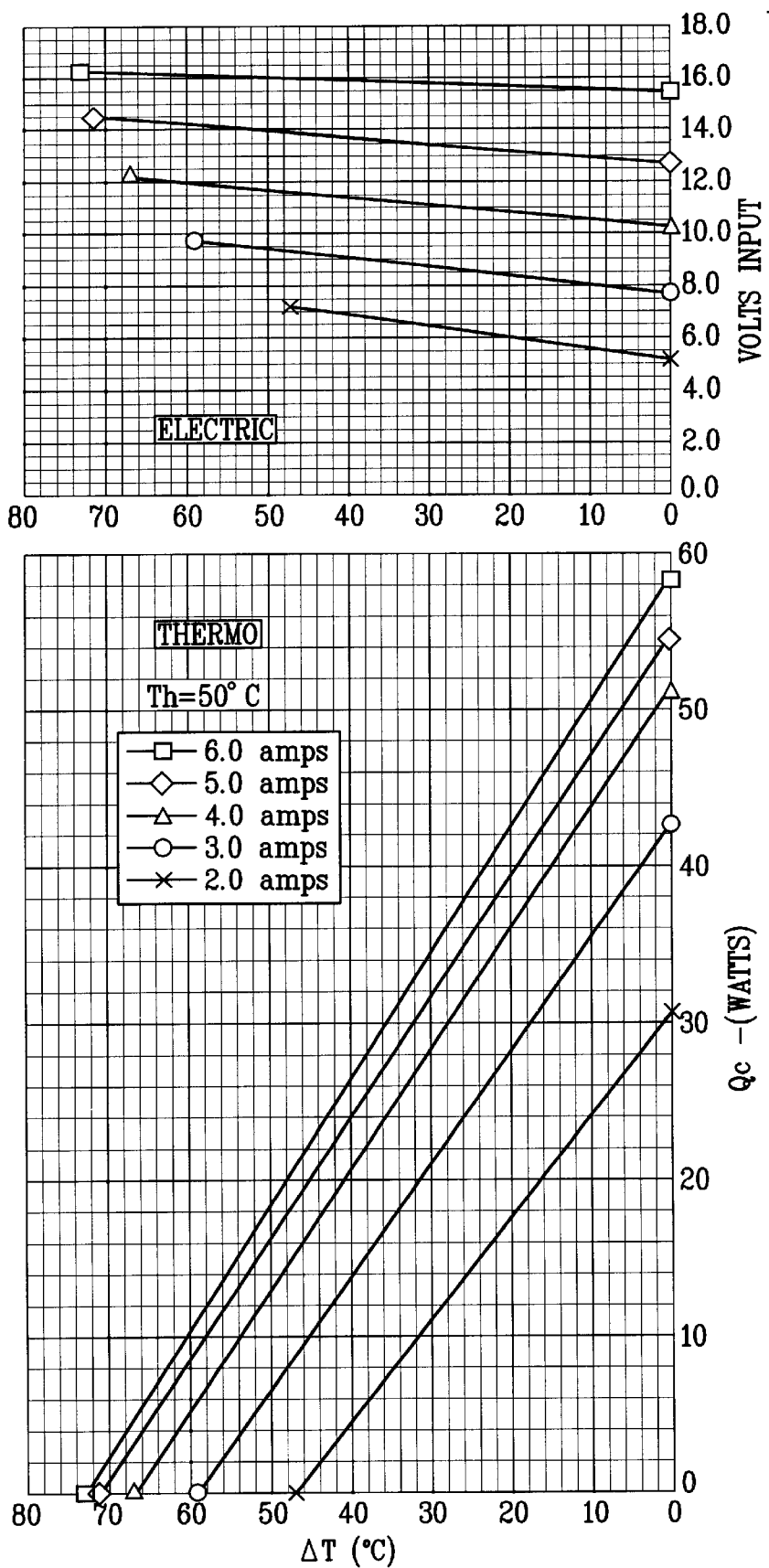

FIGS. 10A, 10B, and 10C show exemplary performance graphs for an exemplary thermoelectric module in accordance with the present invention. The graphs show the electrical and thermodynamic characteristics of an exemplary thermoelectric module along constant current curves. FIG. 10A shows input volts and cooling watts (Qc) versus the difference in hot side temperature and cold side temperature, (temperature difference, or $\Delta T$ as shown in FIGS. 10A, 10B, 10C), of the exemplary thermoelectric module at a fixed hot side temperature (Th) of 25 degrees Celsius. FIGS. 10B and 10C show the same data for fixed hot side temperatures (Th) of 35 degrees Celsius and 50 degrees Celsius, respectively. FIG. 10A shows that for a given (Th) and a given current, cooling watts (Qc) increases and input volts decrease as the temperature difference decreases. FIGS. 10A and 10B show that for a given current and a given temperature difference, as (Th) increases, input volts increase and cooling watts (Qc) increase. However, with a constant voltage power supply, the input volts would not increase and the system would not be able to take advantage of the increased cooling watts available at the increased hot side temperature. Therefore, cooling capacity would not be at the maximum possible for that particular set of operating conditions. A constant current power supply may help increase cooling. However, thermoelectric modules must dissipate not only the load to be cooled, but some waste heat generated internal to the thermoelectric module. If a constant current power supply were utilized, the thermoelectric module may become saturated with the internal waste heat. Therefore, if the power output could be matched to the particular operating conditions of the TEC 1, then the TEC 1 could provide maximum cooling for a given design and set of operating conditions.

In most cases thermal performance of the TEC is limited by the ability of the waste heats exchanger to expel both the active load and the parasitic load heat. A novel solution is to use temperature rise of the hot side temperature, above ambient, to determine final output power levels to the thermoelectric modules 81.

Figure 11:
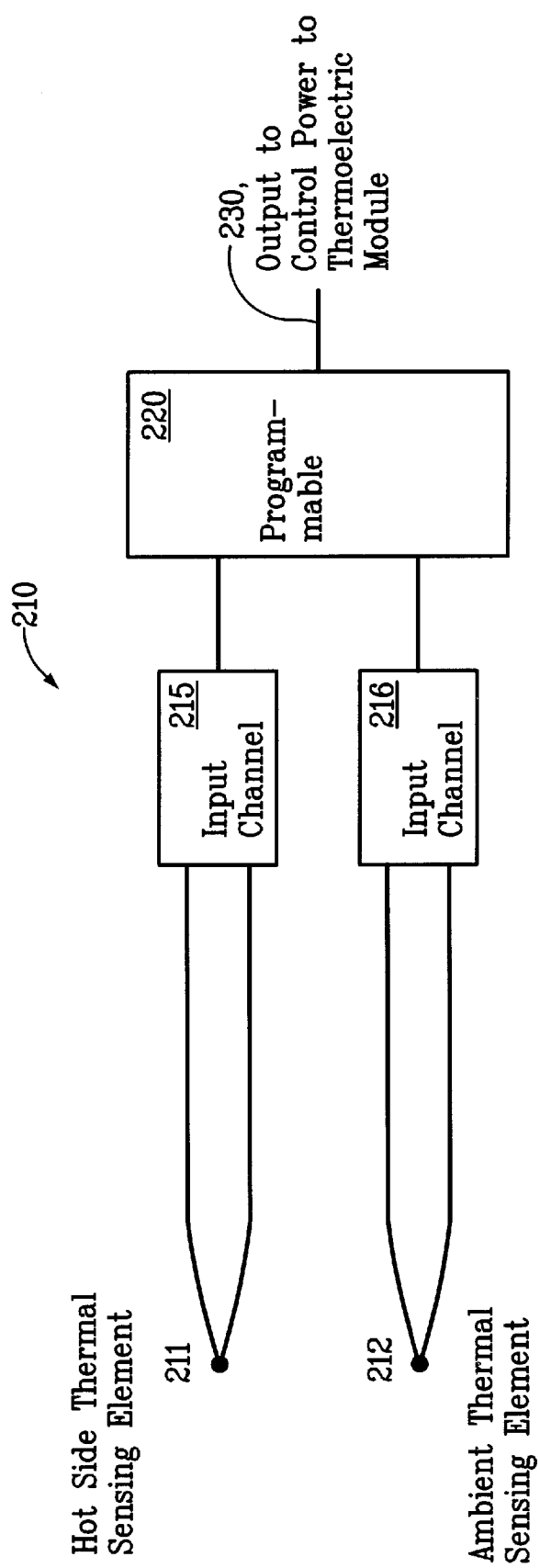
FIG. 11 is a block diagram of an exemplary programmable power control system in accordance with the present invention.

FIG. 11 is a block diagram of an exemplary programmable power control system 210. As shown in FIG. 11, hot side thermal sensing element 211 senses the temperature on the hot side 8 of thermoelectric module 81. Ambient thermal sensing element 212 senses the hot side of the TEC 1 (or the ambient temperature). A thermal sensing element senses temperature and has an electrical characteristic that varies with temperature, for example, resistance or voltage. This electrical characteristic can be sensed and converted to a temperature. Preferably, the thermal sensing elements are type K thermocouples. In operation, the voltage output of a thermocouple varies with temperature sensed. The voltage can be sensed and converted to a temperature. This can be done either analog or digitally.

Input channels 215, 216 are electrically connected to the thermal sensing elements 211, 212, respectively. Input channels 215, 216 sense the thermal sensing elements 211, 212 and convert them to temperature values. Programmable unit 220 reads input channel 215 and input channel 216 and determines the difference in the sensed temperatures. Programmable unit 220 reads from a pre-programmed curve the optimum output power for the given difference in sensed temperatures. A pre-programmed curved is derived from empirical data for each TEC design, as it reacts to different operating conditions. Programmable unit 220 outputs a power control signal 230. Power control signal 230 is appropriately electrically connected to a power system (not shown) to control output power. Either controlling voltage or current may control this output power. Controlling power output allows maximum cooling performance for a given TEC 1 design and under a particular set of operating conditions. Preferably, programmable unit 220 is adapted to output a power control signal that initially output a desired start up power output. Preferably, programmable unit 220 is adapted to ramp up and ramp down the power output to minimize thermal stress on the thermoelectric modules 81.

Figure 12:
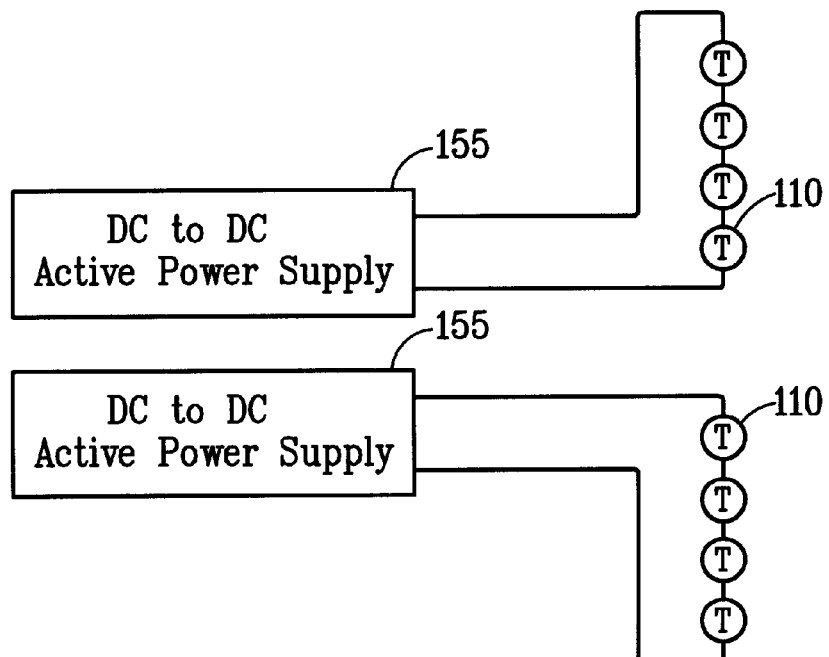
FIG. 12 is schematic diagram of an exemplary dual power supply for use in a TEC in accordance with the present invention.

FIG. 12 shows a schematic diagram of an exemplary dual power supply for use in a TEC in accordance with the present invention. At least two DC to DC active power supplies 155 are provided. As shown in FIG. 12, two DC to DC active power supplies 155 are provided. A first DC to DC active power supply 155 is electrically connected to at least one first thermoelectric module 110. A second DC to DC active power supply 155 is electrically connected to at least one second thermoelectric module 110. As shown in FIG. 12, a first DC to DC active power supply 155 is electrically connected to four first thermoelectric modules 110 and a second DC to DC active power supply is electrically connected to four second thermoelectric modules. This configuration provides power to at least four thermoelectric modules 110 even if one DC to DC active power supply 155 fails. Preferably, there are two DC to DC active power supplies 155 and four thermoelectric modules 110. Alternatively, these numbers may be varied depending on the application.

Alternatively, each DC to DC active power supplies 155 may be electrically connected to a separate power circuit including filter capacitors 156 (not shown), a bridge rectifier 157 (not shown), and a noise suppression filter 158 (not shown), and associated circuitry (not shown).

Figure 13:
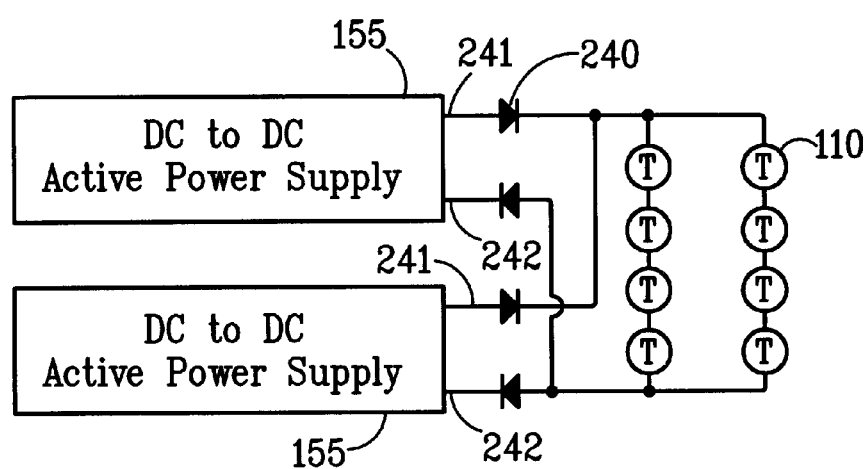
FIG. 13 is schematic diagram of an alternate exemplary dual power supply for use in a TEC in accordance with the present invention.

FIG. 13 shows a schematic diagram of an alternate exemplary dual power supply for use in a TEC in accordance with the present invention. At least two DC to DC active power supplies 155 are provided. As shown in FIG. 13, two DC to DC active power supplies 155 are provided. A first DC to DC active power supply 155 is electrically connected to both at least one first thermoelectric module 110 and to at least one second thermoelectric module 110. A second DC to DC active power supply 155 is electrically connected to both at least one first thermoelectric module 110 and at least one second thermoelectric module 110. Diodes 240 are connected to the positive terminal 241 and negative terminal 242 of each DC to DC active power supply 155, appropriately oriented to prevent power from flowing into the DC to DC active power supply 155. As shown in FIG. 12, each DC to DC active power supply 155 is electrically connected to four thermoelectric modules 110. This configuration provides power to at least four thermoelectric modules 110 even if one DC to DC active power supply 155 fails. Preferably, there are two DC to DC active power supplies 155 and four thermoelectric modules 110. Alternatively, these numbers may be varied depending on the application.

It is noted that the foregoing examples have been provided merely for the purpose of explanation and are in no way to be construed as limiting of the present invention. While the invention has been described with reference to preferred embodiments, it is understood that the words which have been used herein are words of description and illustration, rather than words of limitations. Further, although the invention has been described herein with reference to particular means, materials and embodiments, the invention is not intended to be limited to the particulars disclosed herein; rather, the invention extends to all functionally equivalent structures, methods and uses, such as are within the scope of the appended claims. Those skilled in the art, having the benefit of the teachings of this specification, may effect numerous modifications thereto and changes may be made without departing from the scope and spirit of the invention in its aspects.

What is claimed is:

1. A compact, self-contained thermoelectric cooler comprising:
    a housing having a hot side and a cold side;
    at least one thermoelectric module disposed between said hot side and said cold side;
    a power supply assembly within said housing, wherein said power supply assembly includes a DC to DC active power supply; and
    a mounting frame disposed between said hot side and said cold side.

2. The compact, self-contained thermoelectric cooler of claim 1 wherein said mounting frame has a mounting flange formed over the outer periphery of at least two sides of a planar body of said mounting frame, and that extend outside of said housing for mounting said thermoelectric cooler to an enclosure or device to be cooled.

3. The compact, self-contained thermoelectric cooler of claim 1 wherein said DC to DC active power supply has a compact body with a length of about 4 inches, a width of about 5 inches, and a height of about 3 inches.

4. The compact, self-contained thermoelectric cooler of claim 1 wherein said DC to DC active power supply has a compact body with a length of about 3⅝ inches, a width of about 2½ inches, and a height of about ¾ inch.

5. The compact, self-contained thermoelectric cooler of claim 1 wherein said DC to DC active power supply has a compact body with a length of about 2.2 inches, a width of about 4.6 inches, and a height of about 0.6 inch.

6. The compact, self-contained thermoelectric cooler of claim 1 further comprising:
    a power pack cover having a cavity:
        said power supply assembly includes electrical components, including said DC to DC active power supply, at least one filter capacitor, a bridge rectifier, and a noise suppression filter, said electrical components are disposed in said cavity; and
        wherein said cavity has a length of about 4 inches, a width of about 5 inches, and a height of about 3 inches.

7. The compact, self-contained thermoelectric cooler of claim 1 wherein said power supply assembly further comprises:
    at least one filter capacitor;
    a bridge rectifier; and
    a noise suppression filter.

8. The compact, self-contained thermoelectric cooler of claim 1 further comprising:
    said mounting frame having a power pack cutout in said mounting frame;
    a power pack heat sink having a base portion and a plurality of fins, said power pack heat sink being mounted on said hot side of said mounting frame with said base portion proximate to said power pack cutout;
    a gasket attached to said cold side of said mounting frame proximate to said power pack cutout;
    a power pack cover comprising a base, having four sides extending from a peripheral edge of said base to an outer edge, said base and said four sides defining a cavity, said power pack cover being secured to said gasket, with said outer edge contacting said gasket;
    a barrier between said hot side and said cold side formed by said mounting frame, said gasket, and said power pack cover;
    a plurality of electrical components mounted on said base portion of said power pack heat sink and extending through said power pack cutout and being located on said hot side of said barrier.

9. The compact, self-contained thermoelectric cooler of claim 8 wherein the power pack cover further comprises a cover seal disposed over said outer edge of said power pack cover, with said cover seal contacting said gasket.

10. The compact, self-contained thermoelectric cooler of claim 8 further comprising:
    a hot side cover attached to said hot side of said mounting frame;
    said hot side cover having at least one fan opening in said hot side cover;
    at least one hot side fan mounted to said hot side cover, proximate to said fan opening.

11. The compact, self-contained thermoelectric cooler of claim 8 further comprising:
    a cold side cover attached to said cold side of said mounting frame;
    said cold side cover having at least one fan opening in said cold side cover;
    at least one cold side fan mounted to said cold side cover, proximate to said fan opening.

12. A compact, self-contained moisture resistant thermally isolated thermoelectric cooler comprising:

a housing having a hot side and a cold side;

at least one thermoelectric module disposed between said hot side and said cold side;

a power supply assembly within said housing, wherein said power supply assembly includes a plurality of electrical components;

a mounting frame disposed between said hot side and said cold side;

at least one moisture resistant barrier, around one or more of said at least one thermoelectric module and around said plurality of electrical components; and a thermal resistant barrier between said hot side and said cold side.

13. The compact, self-contained moisture resistant thermally isolated thermoelectric cooler of claim 12 further comprising a first moisture resistant barrier around said plurality of electrical components.

14. The compact, self-contained moisture resistant thermally isolated thermoelectric cooler of claim 13 further comprising:

a power pack heat sink including a base portion and a plurality of fins;

said mounting frame having a power pack cutout in said mounting frame;

said power pack heat sink mounted on said hot side of said mounting frame with said base portion proximate to said power pack cutout;

said plurality of electrical components mounted on said power pack heat sink, and said plurality of electrical components protruding through said power pack cutout;

wherein said first moisture resistant barrier around said plurality of electrical components comprises:

a sealant between said power pack heat sink and said mounting frame;

a gasket attached to said cold side of said mounting frame proximate to said power pack cutout;

a power pack cover including a base having four sides extending from a peripheral edge of the base to an outer edge, and said power pack cover being secured to said gasket; and a cover seal disposed over said outer edge of said power pack cover.

15. The compact, self-contained moisture resistant thermally isolated thermoelectric cooler of claim 14 wherein said sealant is room temperature vulcanized silicone rubber.

16. The compact, self-contained moisture resistant thermally isolating thermoelectric cooler of claim 14 wherein said power pack heat sink further comprises:

said power pack heat sink having a plurality of blind holes in said base portion of said power pack heat sink, corresponding to a plurality of through holes in said power pack cover, and a plurality of fasteners disposed through said plurality of holes in said power pack cover and secured in said plurality of blind holes in said base portion of said power pack heat sink.

17. The compact, self-contained moisture resistant thermally isolated thermoelectric cooler of claim 14 wherein said thermoelectric cooler further comprises:

said power pack cover having a wire opening in said power pack cover;

a sealant disposed in said wire opening.

18. The compact, self-contained moisture resistant thermally isolated thermoelectric cooler of claim 14 wherein said thermoelectric cooler further comprises:

said power pack cover having a wire opening in said power pack cover;

and a liquid tight compression fitting disposed in said wire opening.

19. The compact, self-contained moisture resistant thermally isolated thermoelectric cooler of claim 14 wherein said thermoelectric cooler further comprises:

a wire disposed between said cover seal of said power pack cover and said gasket.

20. The compact, self-contained moisture resistant thermally isolated thermoelectric cooler of claim 13 further comprising:

a hot side heat sink including a base portion, said hot side heat sink mounted on said hot side of said mounting frame with said base portion proximate to said heat sink cutout;

said mounting frame having a heat sink cutout in said mounting frame;

a power pack cutout in said mounting frame;

a power pack heat sink including a base portion and a plurality of fins, said power pack heat sink mounted on said hot side of said mounting frame with said base portion proximate to said power pack cutout;

wherein said thermal barrier comprises:

a sealant between said hot side heat sink and said mounting frame; and a sealant between said power pack heat sink and said mounting frame.

21. The compact, self-contained moisture resistant thermally isolated thermoelectric cooler of claim 20 wherein said thermal barrier further comprises:

a gasket attached to said cold side of said mounting frame proximate to said power pack cutout;

a power pack cover including a base having four sides extending from a peripheral edge of the base to an outer edge, and said power pack cover being secured to said gasket;

a cover seal disposed over said outer edge of said power pack cover;

a sealing frame having a bottom surface, an outer surface extending from a peripheral edge of said bottom surface, and a free edge formed at a distal end of said outer surface, a sealing frame opening in said bottom surface, wherein said sealing frame is mounted on said cold side of said mounting frame proximate to said heat sink cutout;

a sealant between said sealing frame and said mounting frame;

a cold side heat sink having a base portion, and a plurality of fins, said base portion of said cold side heat sink being mounted proximate to said free edge of said sealing frame;

a sealant between said free edge of said sealing frame and said cold side heat sink.

22. The compact, self-contained moisture resistant thermally isolating thermoelectric cooler of claim 21 wherein said sealant is room temperature vulcanized silicone rubber.

23. The compact, self-contained moisture resistant thermally isolating thermoelectric cooler of claim 21 wherein said sealing frame is thermoplastic.

24. The compact, self-contained moisture resistant thermally isolating thermoelectric cooler of claim 21 wherein said sealing frame is fire resistant thermoplastic.

25. The compact, self-contained moisture resistant thermally isolating thermoelectric cooler of claim 21 wherein said power pack heat sink further comprises:

said power pack heat sink having a plurality of blind holes in said base portion of said power pack heat sink, corresponding to a plurality of through holes in said power pack cover, and a plurality of fasteners disposed through said plurality of holes in said power pack cover and secured in said plurality of blind holes in said base portion of said power pack heat sink.

26. The compact, self-contained moisture resistant thermally isolating thermoelectric cooler of claim 21 wherein said hot side heat sink further comprises:

said hot side heat sink having a plurality of blind holes in said base portion of said hot side heat sink, corresponding to a plurality of through holes in said cold side heat sink, and a plurality of fasteners disposed through said plurality of holes in said cold side heat sink and secured in said plurality of blind holes in said base portion of said hot side heat sink.

27. The compact, self-contained moisture resistant thermally isolating thermoelectric cooler of claim 21 wherein said thermoelectric cooler further comprises:

said mounting frame having a wire feed opening in said mounting frame;

a plurality of wires disposed through said wire feed opening;

a sealant disposed within said wire feed opening.

28. The compact, self-contained moisture resistant thermally isolating thermoelectric cooler of claim 21 wherein said thermoelectric cooler further comprises:

said mounting frame having a wire feed opening in said mounting frame;

a liquid tight compression fitting disposed in said wire feed opening;

a plurality of wires disposed through said liquid tight compression fitting.

29. The compact, self-contained moisture resistant thermally isolating thermoelectric cooler of claim 21 further comprising:

thermally conductive spacer blocks are integrally formed in said cold side heat sink.

30. The compact, self-contained moisture resistant thermally isolated thermoelectric cooler of claim 12 further comprising:

a second moisture resistant barrier around said at least one thermoelectric module.

31. The compact, self-contained moisture resistant thermally isolated thermoelectric cooler of claim 30 further comprising:

a hot side heat sink including a base portion and a plurality of fins, said hot side heat sink being mounted on said hot side of said mounting frame with said base portion proximate to said heat sink cutout;

said mounting frame having a heat sink cutout in said mounting frame;

a cold side heat sink having a base portion, and a plurality of fins, said base portion of said cold side heat sink being mounted proximate to said free edge of said sealing frame;

wherein said second moisture resistant barrier comprises:
a sealant between said hot side heat sink and said mounting frame;
a sealing frame having a bottom surface, an outer surface extending from a peripheral edge of said bottom surface, and a free edge formed at a distal end of said outer surface, a sealing frame opening in said bottom surface, wherein said sealing frame is mounted on said cold side of said mounting frame proximate to said heat sink cutout;
a sealant between said sealing frame and said mounting frame;
a sealant between said free edge of said sealing frame and said cold side heat sink.

32. The compact, self-contained moisture resistant thermally isolated thermoelectric cooler of claim 31 wherein said sealant is room temperature vulcanized silicone rubber.

33. The compact, self-contained moisture resistant thermally isolated thermoelectric cooler of claim 31 wherein said sealing frame is thermoplastic.

34. The compact, self-contained moisture resistant thermally isolated thermoelectric cooler of claim 33 wherein said sealing frame is fire resistant thermoplastic.

35. The compact, self-contained moisture resistant thermally isolated thermoelectric cooler of claim 16 wherein said sealing frame further comprises:

a plurality of wire holes in said outer surface of said sealing frame;

a plurality of wires disposed through said plurality of wire holes;

a sealant disposed within said plurality of wire holes.

36. The compact, self-contained moisture resistant thermally isolating thermoelectric cooler of claim 31 wherein said hot side heat sink further comprises:

said hot side heat sink having a plurality of blind holes in said base portion of said hot side heat sink, corresponding to a plurality of through holes in said cold side heat sink, and a plurality of fasteners disposed through said plurality of holes in said cold side heat sink and secured in said plurality of blind holes in said base portion of said hot side heat sink.

37. The compact, self-contained moisture resistant thermally isolated thermoelectric cooler of claim 12 further comprising a thermal barrier between said hot side and said cold side.

38. A compact self-contained thermoelectric cooler comprising:

a housing having a hot side and a cold side;

at least one first thermoelectric module disposed between said hot side and said cold side;

at least one second thermoelectric module disposed between said hot side and said cold side;

a first DC to DC active power supply in said housing, electrically connected to said least one first thermoelectric module;

a second DC to DC active power supply in said housing, electrically connected to said least one second thermoelectric module; and a mounting frame disposed between said hot side and said cold side.

39. The compact self-contained thermoelectric cooler of claim 38 wherein:

said first DC to DC active power supply is also electrically connected to said at least on second thermoelectric module; and said second DC to DC active power supply is also electrically connected to said at least on first thermoelectric module.

* * * * *